(12) United States Patent
Shiomi et al.

(10) Patent No.: US 8,349,078 B2
(45) Date of Patent: Jan. 8, 2013

(54) METHOD OF FORMING NITRIDE SEMICONDUCTOR EPITAXIAL LAYER AND METHOD OF MANUFACTURING NITRIDE SEMICONDUCTOR DEVICE

(75) Inventors: Hiromu Shiomi, Osaka (JP); Yu Saitoh, Itami (JP); Kazuhide Sumiyoshi, Osaka (JP); Akihiro Hachigo, Itami (JP); Makoto Kiyama, Itami (JP); Seiji Nakahata, Itami (JP)

(73) Assignee: Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 12/913,062

(22) Filed: Oct. 27, 2010

(65) Prior Publication Data

US 2011/0223749 A1 Sep. 15, 2011

(30) Foreign Application Priority Data

Jan. 20, 2010 (JP) ................... 2010-010158

(51) Int. Cl.
*C30B 25/20* (2006.01)
*C30B 25/22* (2006.01)
*C30B 29/40* (2006.01)
*H01L 21/306* (2006.01)

(52) U.S. Cl. . 117/105; 438/458; 438/492; 257/E21.097; 257/E21.108; 257/E21.251; 117/915

(58) Field of Classification Search ............... 438/222, 438/226, 341, 357, 363, 406, 413, 416, 442, 438/455, 458, 481, 603, 604, 607; 257/E21.122, 257/E21.09, E21.097, E21.108, E21.117, 257/E21.132, E21.561, E21.567

See application file for complete search history.

(56) References Cited

U.S. PATENT DOCUMENTS

2004/0206967 A1* 10/2004 Oshima et al. ................ 257/85

FOREIGN PATENT DOCUMENTS

| JP | 2003-037286 | 2/2003 |
|---|---|---|
| JP | 2003-178976 | 6/2003 |
| JP | 2005-064188 | 3/2005 |
| JP | 2007-221051 | 8/2007 |

* cited by examiner

*Primary Examiner* — Olik Chaudhuri
*Assistant Examiner* — Su Kim
(74) *Attorney, Agent, or Firm* — Drinker Biddle & Reath LLP

(57) ABSTRACT

The present method of forming a nitride semiconductor epitaxial layer includes the steps of growing at least one layer of nitride semiconductor epitaxial layer on a nitride semiconductor substrate having a dislocation density lower than or equal to $1 \times 10^7$ cm$^{-2}$ with a chemical decomposition layer interposed therebetween, the chemical decomposition layer being chemically decomposed at least with either a gas or an electrolytic solution, and decomposing the chemical decomposition layer at least with either the gas or the electrolytic solution at least either during or after the step of growing the nitride semiconductor epitaxial layer, thereby separating the nitride semiconductor epitaxial layer from the nitride semiconductor substrate. A high-quality nitride semiconductor epitaxial layer suffering less damage when separated from the nitride semiconductor substrate is thereby formed.

35 Claims, 25 Drawing Sheets

(A)

(B)

(C)

(D)

(A)

(B)

(A)

(B)

(A)

(B)

(C)

(A)

(B)

(C)

(A)

(B)

(C)

(A)

(B)

(C)

(A)

(B)

(C)

(A)

(B)

(C)

(A)

(B)

(C)

(A)

(B)

(C)

(A)

(B)

(C)

METHOD OF FORMING NITRIDE SEMICONDUCTOR EPITAXIAL LAYER AND METHOD OF MANUFACTURING NITRIDE SEMICONDUCTOR DEVICE

BACKGROUND OF THE INVENTION

1. Field of the Invention

The present invention relates to a method of forming a nitride semiconductor epitaxial layer suitably used for a nitride semiconductor device, and a method of manufacturing a nitride semiconductor device including such nitride semiconductor epitaxial layer.

2. Description of the Background Art

Various methods are being studied for obtaining a compact, high-performance nitride semiconductor device by separating a nitride semiconductor epitaxial layer formed on a substrate from the substrate.

For example, Japanese Patent Laying-Open No. 2003-037286 relates to a method of manufacturing a semiconductor device, and discloses, in order to reduce a stress applied by the substrate to a semiconductor layer and to facilitate separation of the semiconductor layer from the substrate, the steps of forming a first semiconductor layer on a mother substrate, irradiating a surface of the mother substrate opposite to the first semiconductor layer with light, to thereby form a thermal decomposition layer made of the first semiconductor layer having been thermally decomposed, between the first semiconductor layer and the mother substrate, forming a second semiconductor layer including an active layer on the first semiconductor layer with the thermal decomposition layer formed thereon, and removing the thermal decomposition layer, to thereby separate the mother substrate from the first semiconductor layer.

Japanese Patent Laying-Open No. 2007-221051 relates to a method of manufacturing a nitride-based semiconductor element, and discloses, in order to improve separation of the substrate from the semiconductor element layer to suppress reduction in yields, the steps of growing, on a first substrate, a semiconductor element layer having a layer made of at least one or more layers of nitride-based semiconductor, forming a second substrate on the semiconductor element layer, irradiating the second substrate with laser light that is transmitted through the second substrate and the semiconductor element layer and absorbed into the first substrate, to thereby separate the first substrate.

Japanese Patent Laying-Open No. 2003-178976 relates to a method of manufacturing a semiconductor device, and discloses, during manufacture of a semiconductor device having a layer at least containing a III-group element and N (nitrogen) on a Si-based substrate, forming a layer at least containing InN on a surface of the Si-based substrate at less than or equal to 700° C., and raising the temperature to more than or equal to 900° C., thereby forming a structure in which the surface of the III-group element Si-based substrate has a step shape formed by periodic recess-like stripes, recess portions serving as air gaps, in order to prevent cracks from occurring during epitaxial growth to improve distributions of a-axis orientation in a C plane.

Japanese Patent Laying-Open No. 2005-064188 relates to a method of recovering and reproducing a substrate as well as a method of manufacturing a semiconductor wafer, and discloses a method of recovering a first substrate including the steps of bonding a second substrate to a semiconductor layer epitaxially grown on the first substrate, and separating the semiconductor layer and the first substrate.

SUMMARY OF THE INVENTION

However, the method of manufacturing a semiconductor device described in Japanese Patent Laying-Open No. 2003-037286 is disadvantageous in that, since thermal decomposition by light irradiation is performed, local thermal conduction damages the semiconductor layer constituting the semiconductor layer device.

The method of manufacturing a nitride-based semiconductor element described in Japanese Patent Laying-Open No. 2007-221051 is disadvantageous in that, since thermal decomposition by laser light irradiation is performed, the semiconductor element layer constituting the nitride-based semiconductor element is damaged. Particularly, the method has disadvantages such as time-consuming separation of the first substrate from the semiconductor element layer due to laser light scanning, inevitable distortions due to local thermal stresses because energy is concentrated on laser light, and damage to the whole semiconductor element layer due to passage of laser light through the semiconductor element layer.

The method of manufacturing a semiconductor device described in Japanese Patent Laying-Open No. 2003-178976, wherein cracks which would be caused by the difference in thermal expansion coefficient between the Si-based substrate and the III-group nitride semiconductor layer are relieved by air gaps, is disadvantageous in that the group-III nitride semiconductor layer grown on the Si-based substrate has a higher dislocation density than the group-III nitride semiconductor substrate because the III-group nitride semiconductor layer is still subject to distortions due to thermal stresses.

The method of recovering the first substrate described in Japanese Patent Laying-Open No. 2005-064188 includes, as a method of separating the semiconductor layer and the first substrate, a mechanically slicing method, a chemical treatment such as electrolytic etching, and the like. As an example of electrolytic etching, it describes forming a III-group nitride layer doped with a great amount of Si or the like having a specific resistance of approximately $10^{-2}$ Ω·cm as a conductive layer between the first substrate as a III-group nitride substrate and the semiconductor layer as a group-III nitride semiconductor layer, and flowing an electric current of approximately 1 mA in a KOH aqueous solution of approximately 1N with a Pt cathode provided and the conductive layer serving as an anode, so that the conductive layer is etched. However, such a separation method by etching the conductive layer is disadvantageous in that the semiconductor layer to be separated is also etched.

The present invention has an object to solve the above-mentioned problems, and to provide a method of forming a high-quality nitride semiconductor epitaxial layer suffering less damage when separated from the nitride semiconductor substrate, and a method of manufacturing a nitride semiconductor device including the nitride semiconductor epitaxial layer.

The present invention, in accordance with an aspect, is a method of forming a nitride semiconductor epitaxial layer, including the steps of growing at least one layer of nitride semiconductor epitaxial layer on a nitride semiconductor substrate having a dislocation density lower than or equal to $1 \times 10^7$ cm$^{-2}$ with a chemical decomposition layer interposed therebetween, the chemical decomposition layer being chemically decomposed at least with one of a gas and an electrolytic solution, and decomposing the chemical decomposition layer at least with one of the gas and the electrolytic solution at least one of during and after the step of growing the nitride semiconductor epitaxial layer, thereby separating the nitride semiconductor epitaxial layer from the nitride semiconductor substrate.

In the method of forming a nitride semiconductor epitaxial layer in accordance with the present invention, decomposition of the chemical decomposition layer after the step of growing the nitride semiconductor epitaxial layer can be performed by bringing at least the chemical decomposition layer into contact with the electrolytic solution. Herein, the electrolytic solution is in contact with the chemical decomposition layer and the nitride semiconductor epitaxial layer, and can contain at least one of a chemical substance promoting decomposition of the chemical decomposition layer and a chemical substance suppressing decomposition of the nitride semiconductor epitaxial layer.

In the method of forming a nitride semiconductor epitaxial layer in accordance with the present invention, decomposition of the chemical decomposition layer during the step of growing the nitride semiconductor epitaxial layer is performed by bringing at least the chemical decomposition layer into contact with the gas containing at least one of a hydrogen gas and an ammonia gas, and decomposition of the chemical decomposition layer after the step of growing the nitride semiconductor epitaxial layer is performed by bringing at least the chemical decomposition layer into contact with the electrolytic solution.

In the method of forming a nitride semiconductor epitaxial layer in accordance with the present invention, in the step of growing the nitride semiconductor epitaxial layer, a hole supply layer supplying a hole to the chemical decomposition layer can be formed in proximity to the chemical decomposition layer and between the nitride semiconductor substrate and the nitride semiconductor epitaxial layer. The chemical decomposition layer can be irradiated with light while at least the chemical decomposition layer is in contact with the electrolytic solution. A cathode is located in the electrolytic solution, and a voltage can be applied across the chemical decomposition layer and the cathode such that the chemical decomposition layer serves as an anode, while at least the chemical decomposition layer is in contact with the electrolytic solution. A voltage can be applied across the nitride semiconductor substrate and the nitride semiconductor epitaxial layer such that the nitride semiconductor substrate serves as an anode and the nitride semiconductor epitaxial layer serves as a cathode, while the nitride semiconductor substrate, the chemical decomposition layer, and the nitride semiconductor epitaxial layer are in contact with the electrolytic solution.

In the method of forming a nitride semiconductor epitaxial layer in accordance with the present invention, decomposition of the chemical decomposition layer at least one of during and after the step of growing the nitride semiconductor epitaxial layer can be performed by bringing the chemical decomposition layer into contact with the gas containing at least one of a hydrogen gas and an ammonia gas. Herein, in the step of growing the nitride semiconductor epitaxial layer, the chemical decomposition layer can be grown at an ambient temperature less than or equal to 900° C., and the chemical decomposition layer can be decomposed at an ambient temperature more than or equal to 1000° C.

In the method of forming a nitride semiconductor epitaxial layer in accordance with the present invention, decomposition of the chemical decomposition layer at least with one of the gas and the electrolytic solution can be performed further by applying a stress at least to part of the chemical decomposition layer. Decomposition of the chemical decomposition layer at least with one of the gas and the electrolytic solution can be performed by jetting at least one of the gas and the electrolytic solution at least to part of the chemical decomposition layer. Decomposition of the chemical decomposition layer at least with one of the gas and the electrolytic solution can be performed further by applying one of light and heat at least to part of the chemical decomposition layer. Herein, at least one of the gas and the electrolytic solution can contain a chemical substance suppressing decomposition of the nitride semiconductor epitaxial layer.

In the method of forming a nitride semiconductor epitaxial layer in accordance with the present invention, the chemical decomposition layer can be a nitride semiconductor layer containing indium. The nitride semiconductor epitaxial layer can contain a III-group element other than indium. The chemical decomposition layer can have an indium composition relative to nitrogen more than or equal to 15 mol %. The chemical decomposition layer can have an indium composition gradient structure in which an indium composition relative to nitrogen in the decomposition layer increases from a first main surface to an inner portion and decreases from the inner portion to a second main surface.

In the method of forming a nitride semiconductor epitaxial layer in accordance with the present invention, the chemical decomposition layer can further contain aluminum. Herein, a difference in lattice constant between the chemical decomposition layer and a GaN semiconductor relative to the lattice constant of the GaN semiconductor can be less than or equal to 1%. The chemical decomposition layer can have an indium composition relative to nitrogen more than or equal to 15 mol % and less than or equal to 20 mol %. The electrolytic solution can contain a compound selectively coordinated to an indium ion.

In the method of forming a nitride semiconductor epitaxial layer in accordance with the present invention, the chemical decomposition layer can be one of a metal layer, a metal oxide layer, and a silicon-containing layer.

In the method of forming a nitride semiconductor epitaxial layer in accordance with the present invention, the nitride semiconductor epitaxial layer can have a dislocation density lower than or equal to $1 \times 10^{17}$ cm$^{-2}$.

In the method of forming a nitride semiconductor epitaxial layer in accordance with the present invention, the nitride semiconductor substrate can be a GaN substrate, and the nitride semiconductor epitaxial layer can be a GaN epitaxial layer. Herein, the electrolytic solution can contain a gallium ion.

In the method of forming a nitride semiconductor epitaxial layer in accordance with the present invention, the nitride semiconductor epitaxial layer as separated can have a thickness more than or equal to 3 μm and less than or equal to 100 μm. The nitride semiconductor epitaxial layer as separated can include a layer having a thickness more than or equal to 3 μm and less than or equal to 20 μm and a carrier concentration less than or equal to $2 \times 10^{16}$ cm$^{-3}$.

The method of forming a nitride semiconductor epitaxial layer in accordance with the present invention further includes the steps of after the step of separating the nitride semiconductor epitaxial layer from the nitride semiconductor substrate, surface treating a main surface of the nitride semiconductor substrate as separated to reproduce the nitride semiconductor substrate, growing at least one layer of further nitride semiconductor epitaxial layer on the nitride semiconductor substrate as reproduced with another chemical decomposition layer interposed therebetween, and decomposing the other chemical decomposition layer at least with one of the gas and the electrolytic solution at least one of during and after the step of growing the further nitride semiconductor epitaxial layer, thereby separating the further nitride semiconductor epitaxial layer from the nitride semiconductor substrate as reproduced.

The present invention, in accordance with another aspect, is a method of manufacturing a nitride semiconductor device, including the steps of growing at least one layer of nitride semiconductor epitaxial layer on a nitride semiconductor substrate having a dislocation density lower than or equal to $1 \times 10^7$ cm$^{-2}$ with a chemical decomposition layer interposed therebetween, the chemical decomposition layer being chemically decomposed at least with one of a gas and an electrolytic solution, decomposing the chemical decomposition layer at least with one of the gas and the electrolytic solution at least one of during and after the step of growing the nitride semiconductor epitaxial layer, thereby separating the nitride semiconductor epitaxial layer from the nitride semiconductor substrate, and joining the semiconductor epitaxial layer as separated to a supporting substrate.

In the method of manufacturing a nitride semiconductor device in accordance with the present invention, the supporting substrate can be a conductive supporting substrate having an area specific resistance less than or equal to 0.05 mΩ·cm$^2$. The method can further include the step of forming a recess having a depth from a main surface of the nitride semiconductor epitaxial layer to reach the chemical decomposition layer, after the step of growing the nitride semiconductor epitaxial layer and before the step of separating the nitride semiconductor epitaxial layer from the nitride semiconductor substrate. The recess can be formed by gas phase etching.

The present invention can provide a method of forming a high-quality nitride semiconductor epitaxial layer suffering less damage when separated from a nitride semiconductor substrate, as well as a method of manufacturing a nitride semiconductor device including the nitride semiconductor epitaxial layer.

The foregoing and other objects, features, aspects and advantages of the present invention will become more apparent from the following detailed description of the present invention when taken in conjunction with the accompanying drawings.

a state while the chemical decomposition layer is decomposed, and (C) a state after the chemical decomposition layer has been decomposed.

Figure 12:
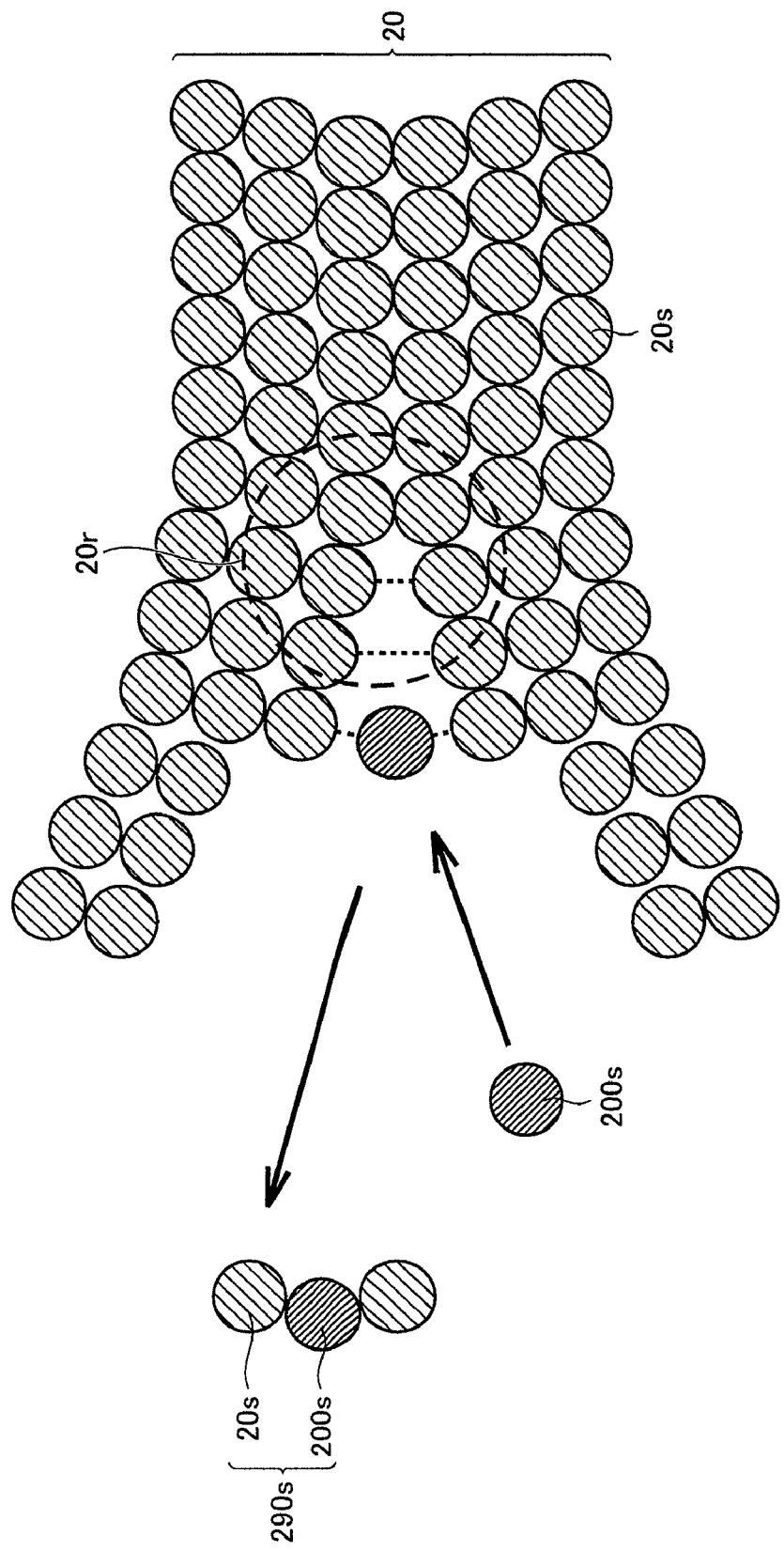

FIG. 12 is a schematic cross sectional view showing a mechanism of decomposition of the chemical decomposition layer in the method of decomposing the chemical decomposition layer by jetting at least either the gas or the electrolytic solution.

Figure 13:
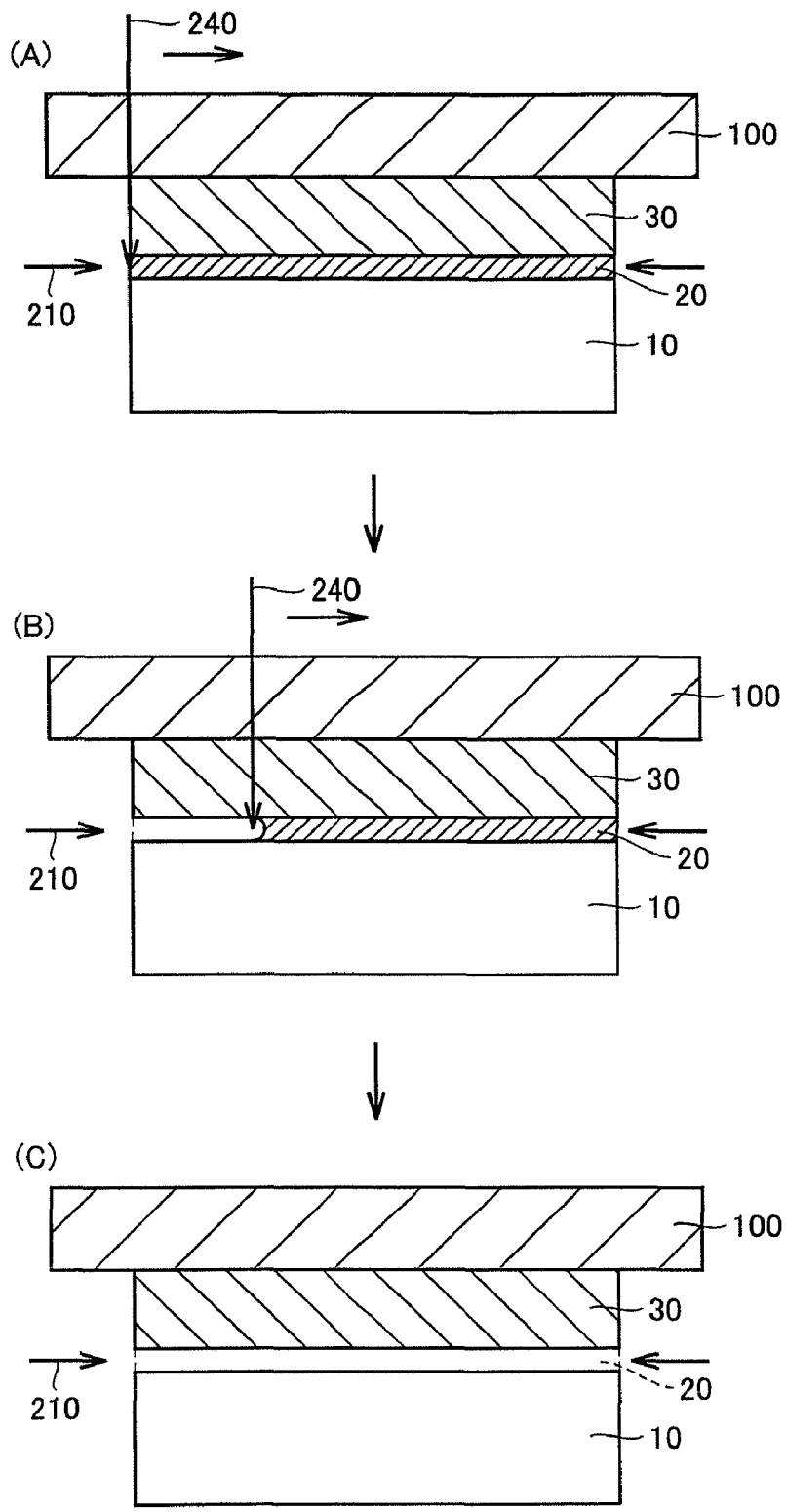

FIG. 13 is a schematic cross sectional view showing a method of decomposing the chemical decomposition layer with the gas and further by applying light or heat at least to part of the chemical decomposition layer, illustrating (A) a state before the chemical decomposition layer is decomposed, (B) a state while the chemical decomposition layer is decomposed, and (C) a state after the chemical decomposition layer has been decomposed.

Figure 14:
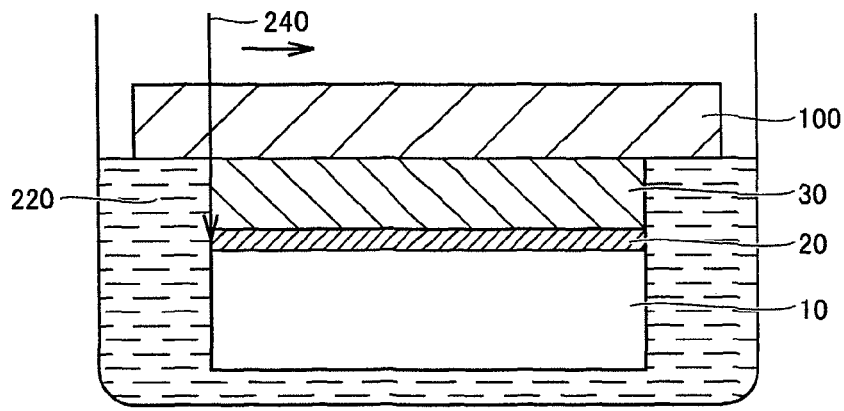
Figure 14:
Figure 14:
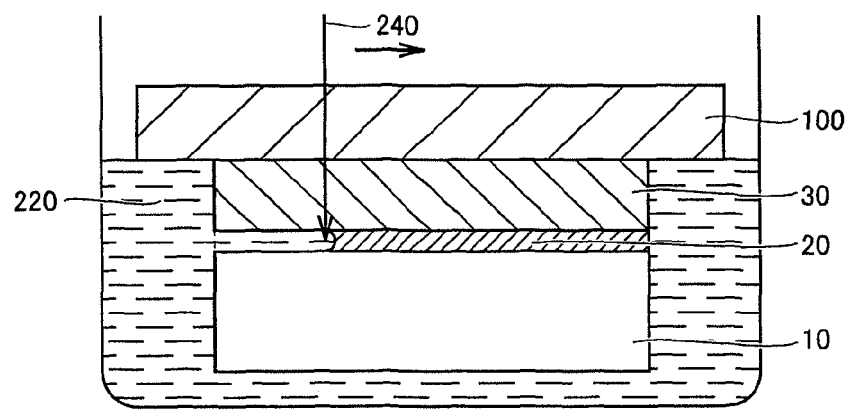
Figure 14:
Figure 14:
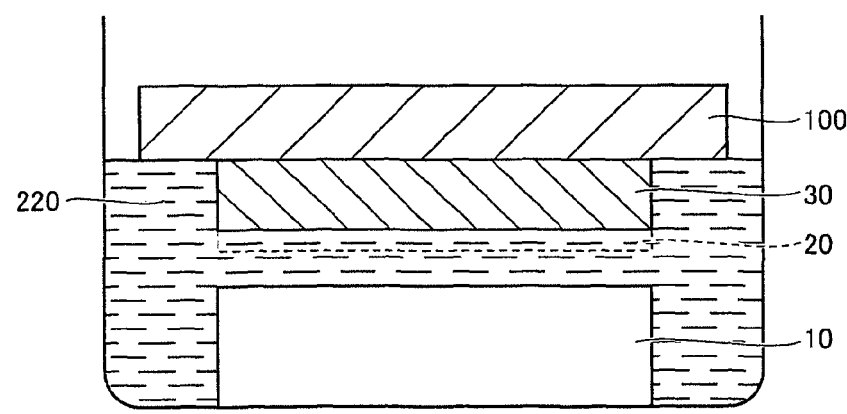

FIG. 14 is a schematic cross sectional view showing a method of decomposing the chemical decomposition layer with the electrolytic solution and further by applying light or heat at least to part of the chemical decomposition layer, illustrating (A) a state before the chemical decomposition layer is decomposed, (B) a state while the chemical decomposition layer is decomposed, and (C) a state after the chemical decomposition layer has been decomposed.

Figure 15:
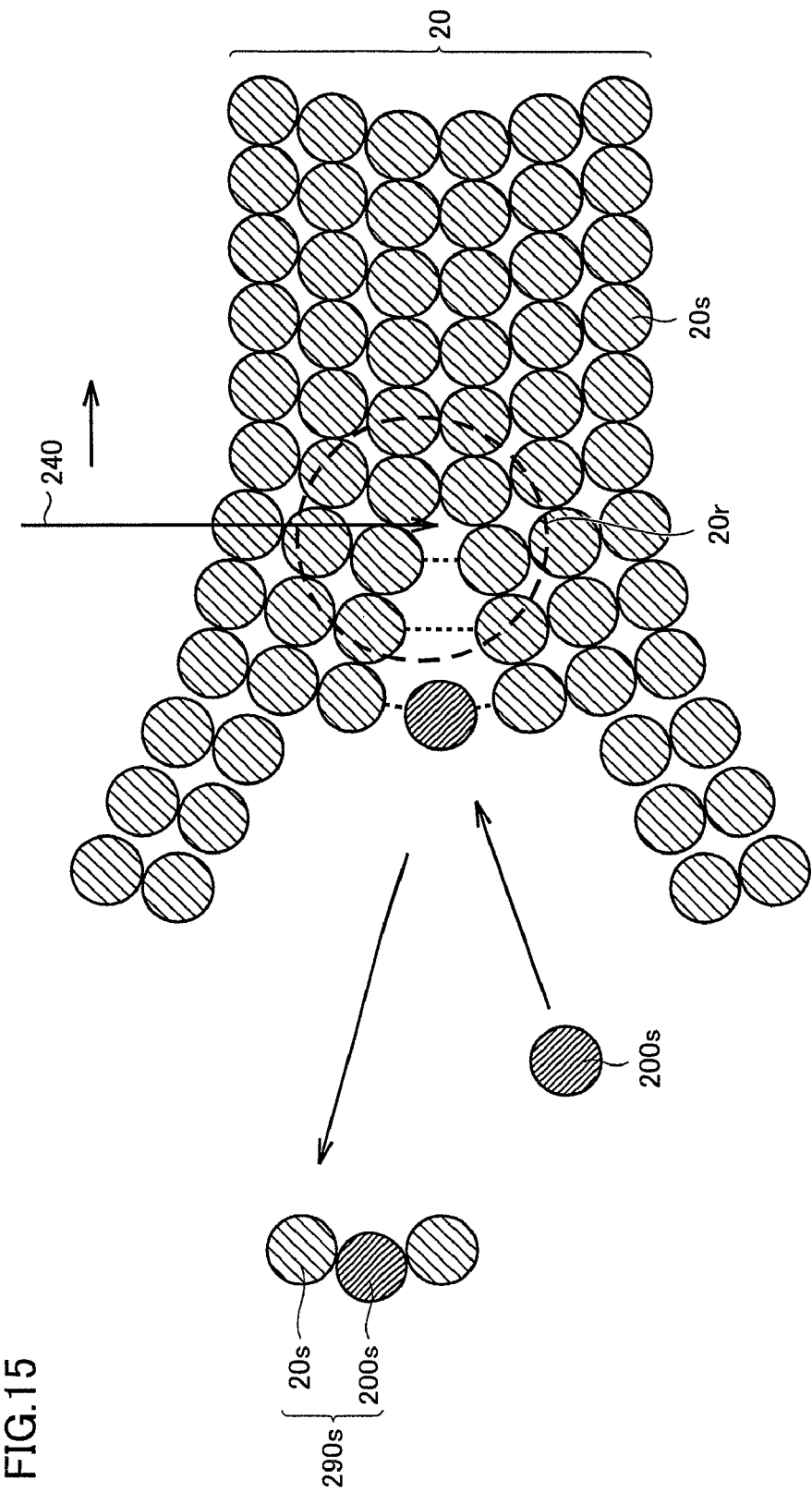

FIG. 15 is a schematic cross sectional view showing a mechanism of decomposition of the chemical decomposition layer in the method of decomposing the chemical decomposition layer at least with either the gas or the electrolytic solution and further by applying light or heat at least to part of the chemical decomposition layer.

Figure 16:
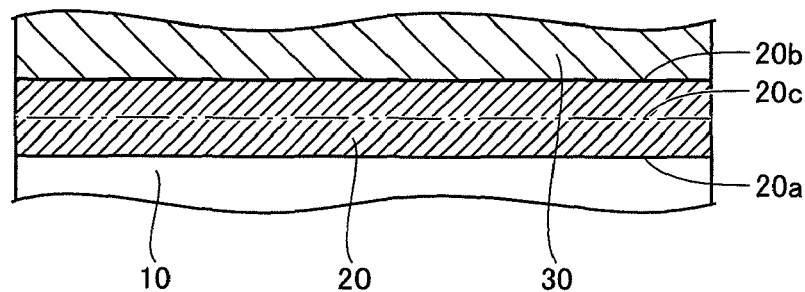

FIG. 16 is an enlarged schematic cross sectional view of an example chemical decomposition layer.

Figure 17:
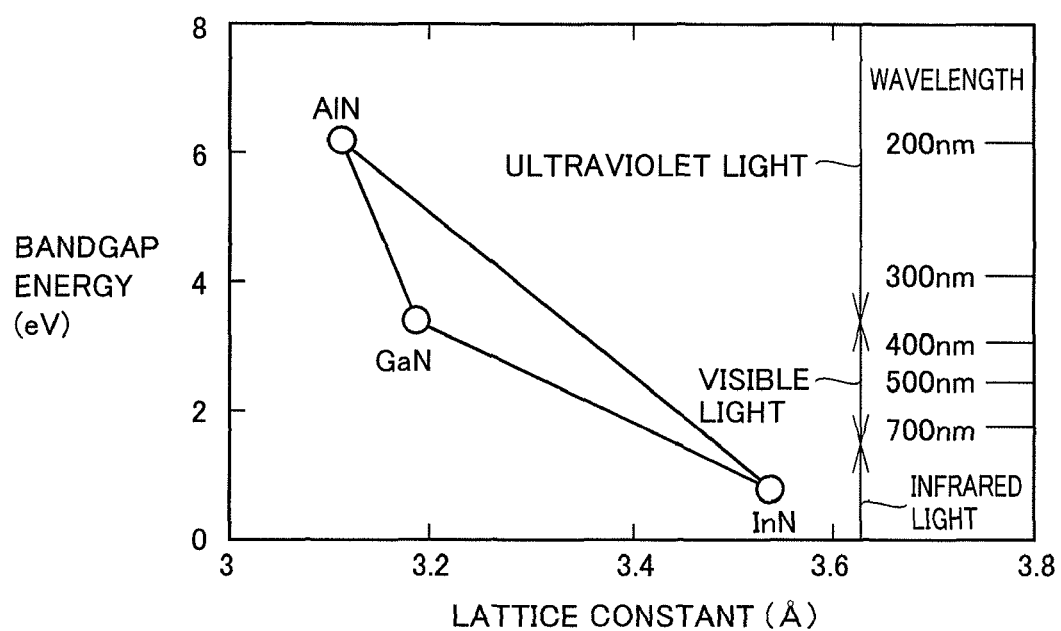

FIG. 17 is a graph showing a relation between lattice constant and bandgap energy of nitride semiconductor.

Figure 18A:
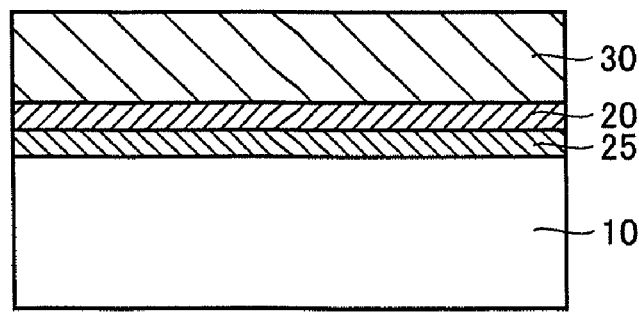

FIG. 18A is a schematic cross sectional view showing a case where a hole supply layer is formed between the nitride semiconductor substrate and the chemical decomposition layer in the step of growing the nitride semiconductor epitaxial layer.

Figure 18B:
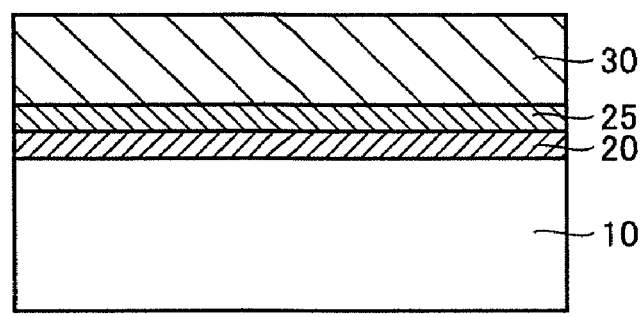

FIG. 18B is a schematic cross sectional view showing a case where the hole supply layer is formed between the chemical decomposition layer and the nitride semiconductor epitaxial layer in the step of growing the nitride semiconductor epitaxial layer.

Figure 18C:
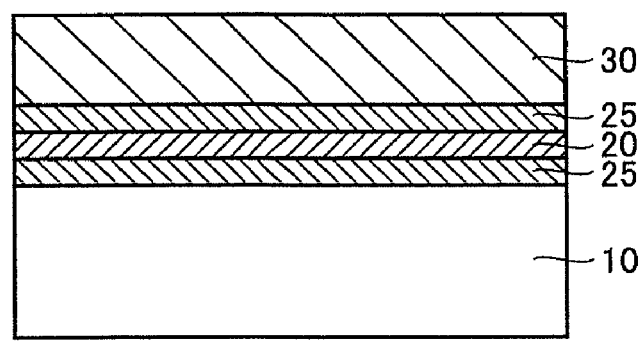

FIG. 18C is a schematic cross sectional view showing a case where the hole supply layers are formed between the nitride semiconductor substrate and the chemical decomposition layer and between the chemical decomposition layer and the nitride semiconductor epitaxial layer, respectively, in the step of growing the nitride semiconductor epitaxial layer.

Figure 19:
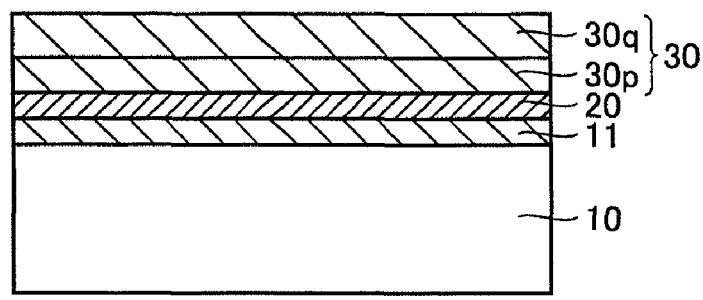
Figure 19:
Figure 19:
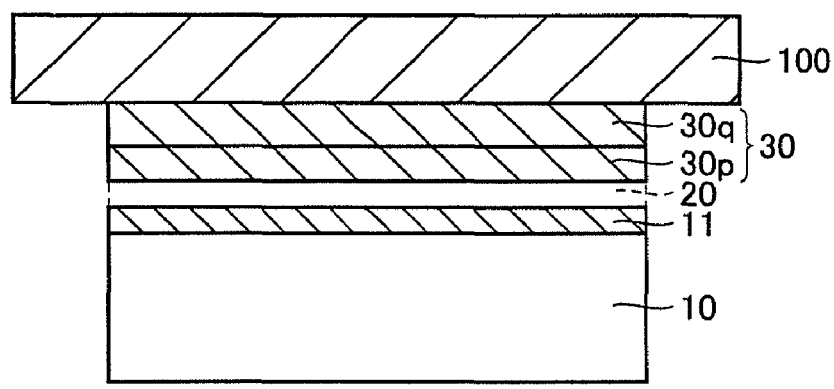
Figure 19:
Figure 19:
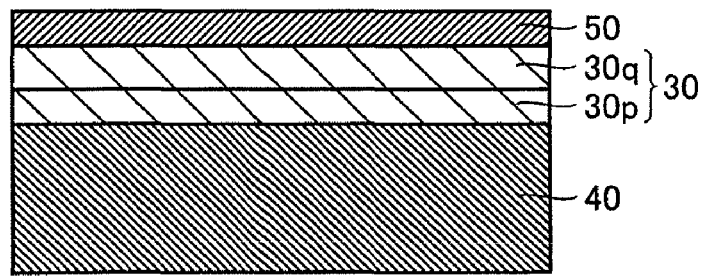

FIG. 19 is a schematic cross sectional view showing an example method of manufacturing a nitride semiconductor device in accordance with the present invention, illustrating the steps of (A) growing the nitride semiconductor epitaxial layer, (B) separating the nitride semiconductor epitaxial layer from the nitride semiconductor substrate, and (C) joining the separated nitride semiconductor epitaxial layer to the supporting substrate.

Figure 20:
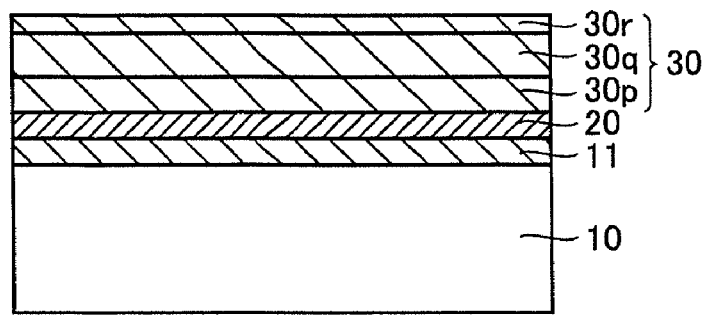
Figure 20:
Figure 20:
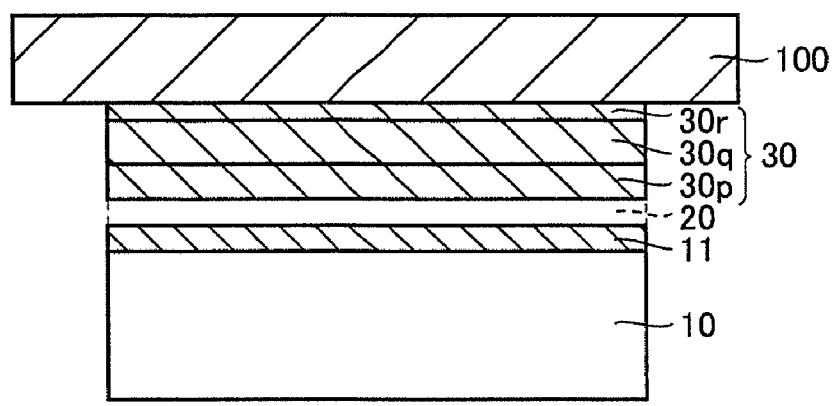
Figure 20:
Figure 20:
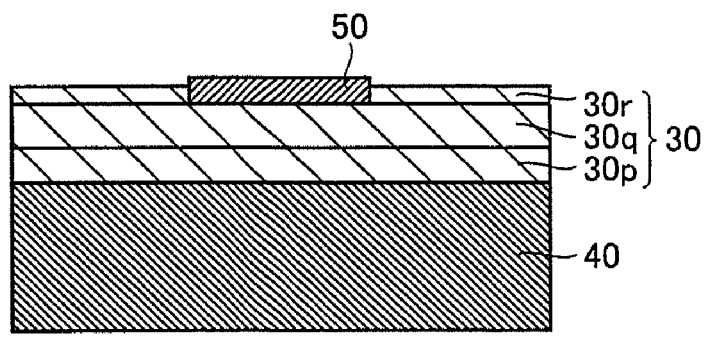

FIG. 20 is a schematic cross sectional view showing another example method of manufacturing a nitride semiconductor device in accordance with the present invention, illustrating the steps of (A) growing the nitride semiconductor epitaxial layer, (B) separating the nitride semiconductor epitaxial layer from the nitride semiconductor substrate, and (C) joining the separated nitride semiconductor epitaxial layer to the supporting substrate.

Figure 21:
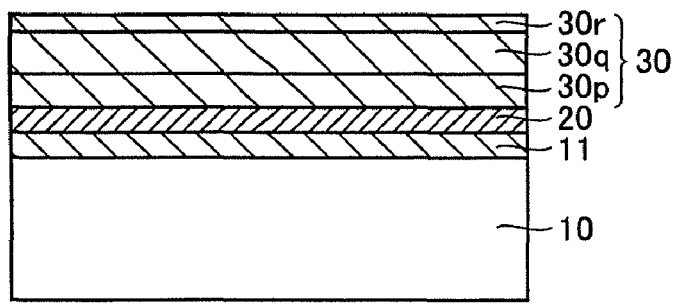
Figure 21:
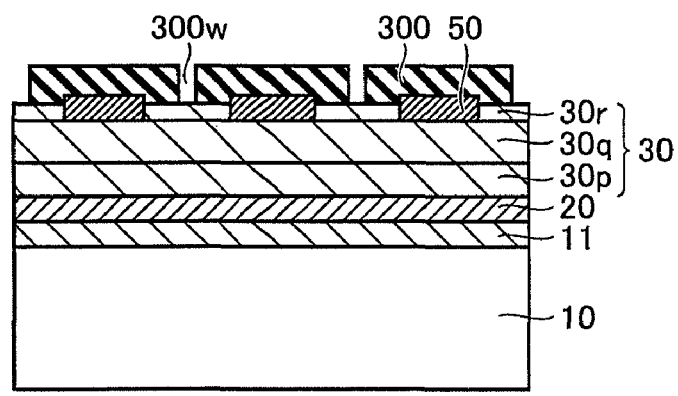
Figure 21:
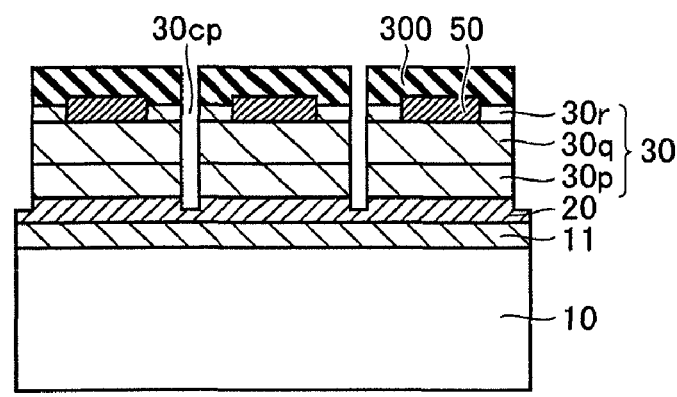

FIG. 21 is a schematic cross sectional view showing the first half of steps of still another example method of manufacturing a nitride semiconductor device in accordance with the present invention, illustrating the steps of (A) growing the nitride semiconductor epitaxial layer, (B) forming an electrode and a mask on the nitride semiconductor epitaxial layer, and (C) forming a recess in the nitride semiconductor epitaxial layer.

Figure 22:
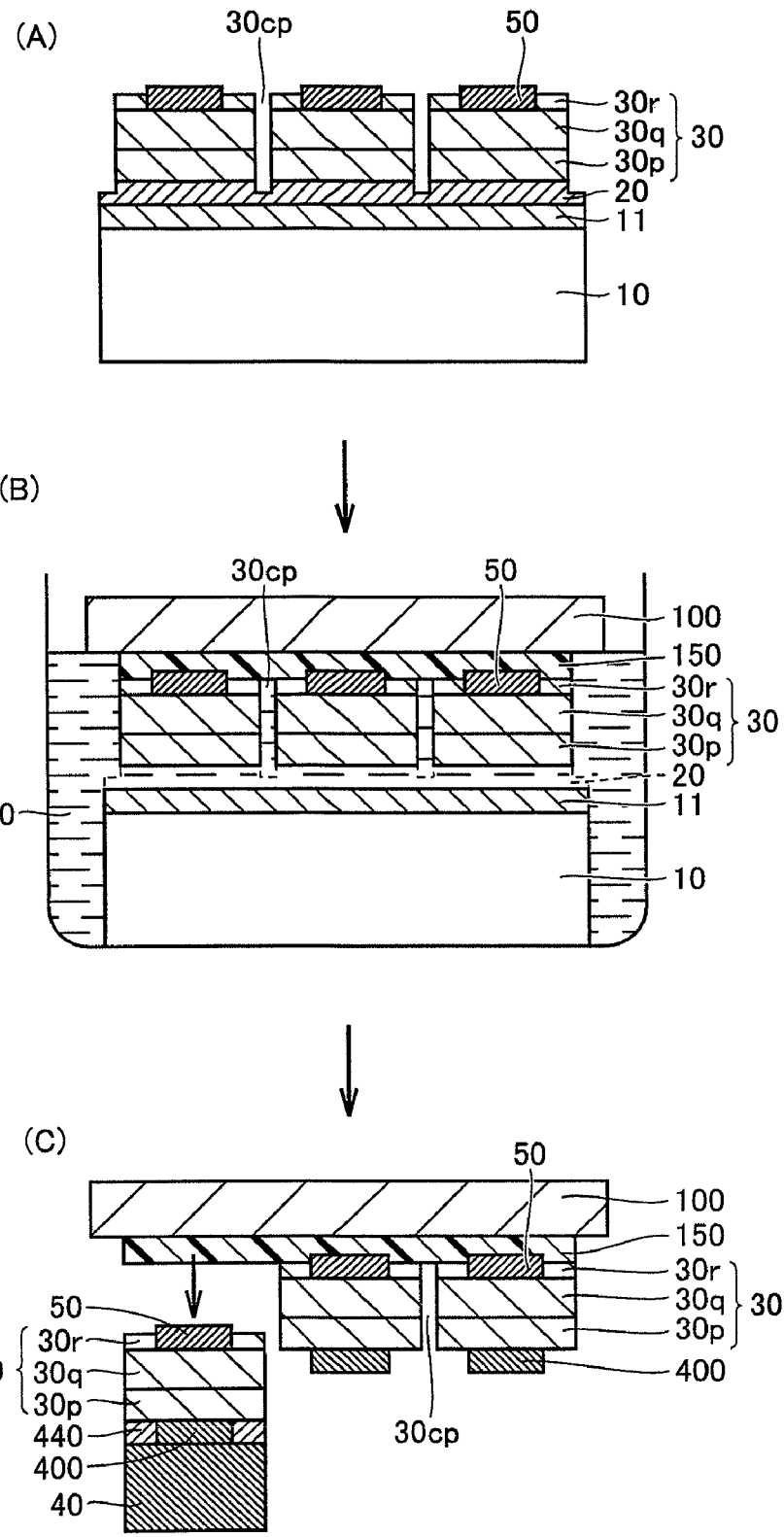
Figure 23:
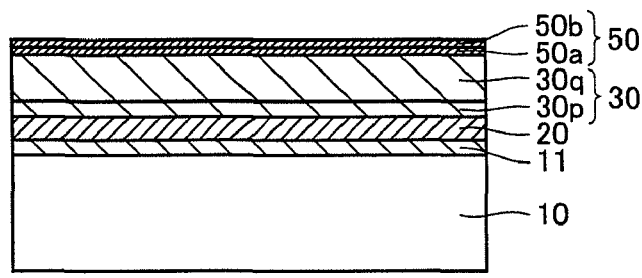
Figure 23:
Figure 23:
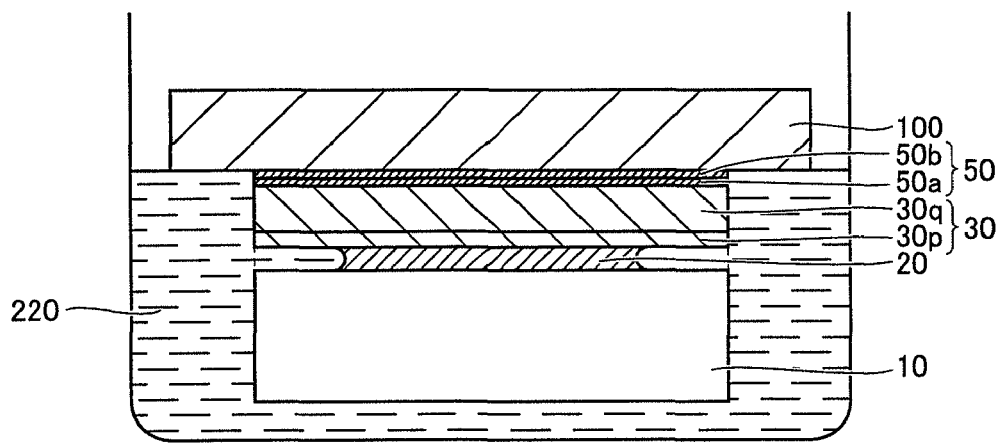
Figure 23:
Figure 23:
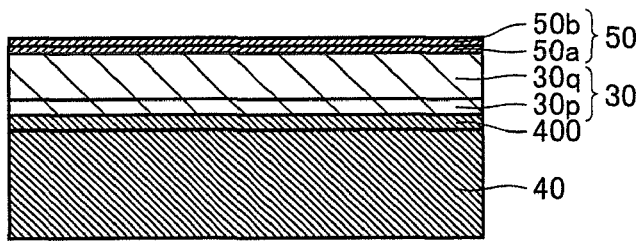
Figure 24:
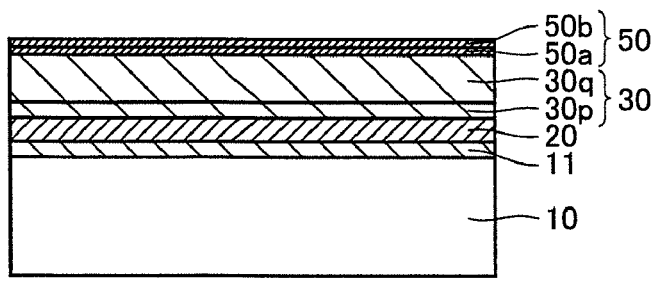
Figure 24:
Figure 24:
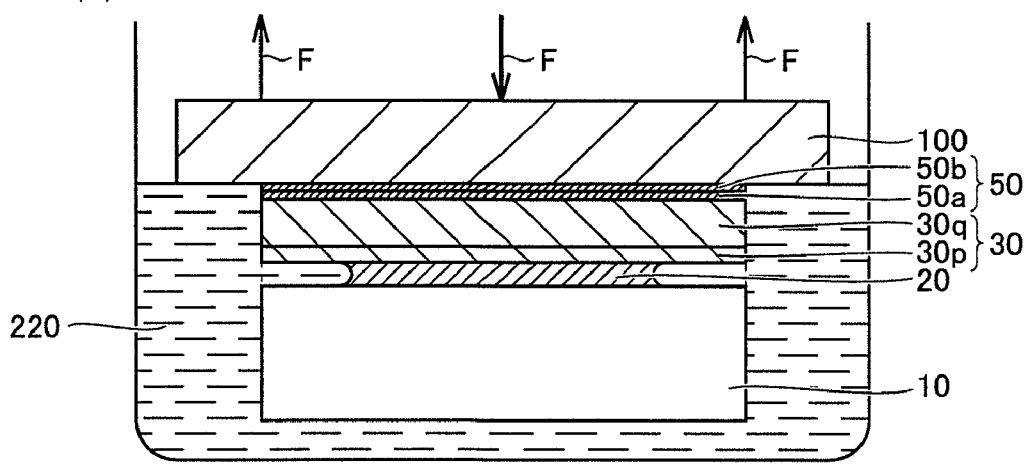
Figure 24:
Figure 24:
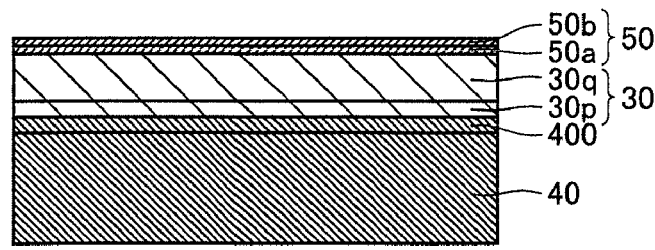
Figure 25:
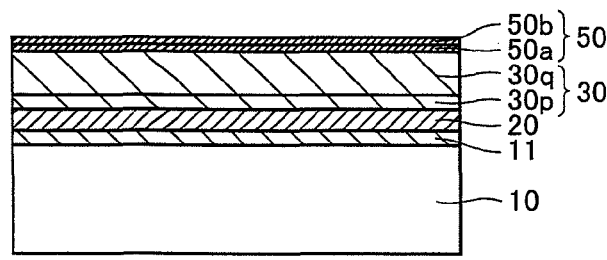
Figure 25:
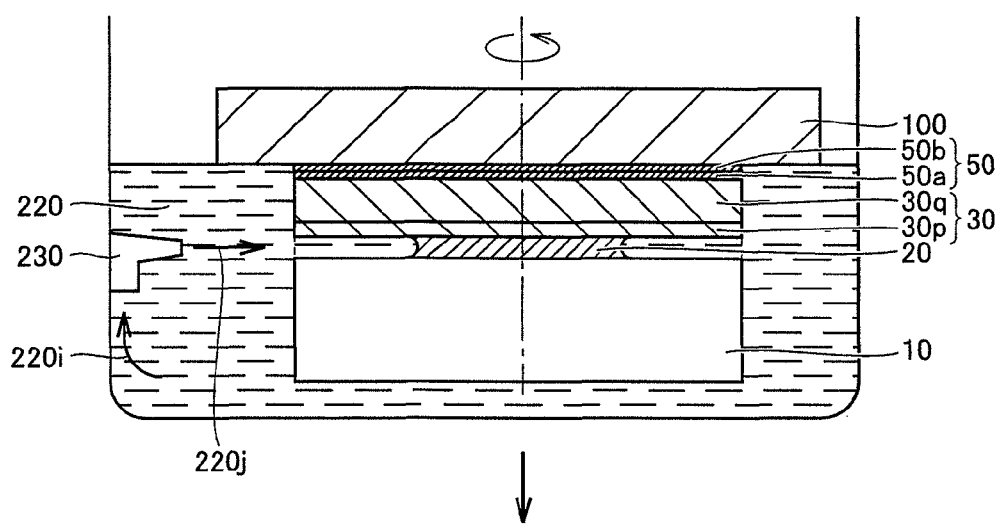
Figure 25:
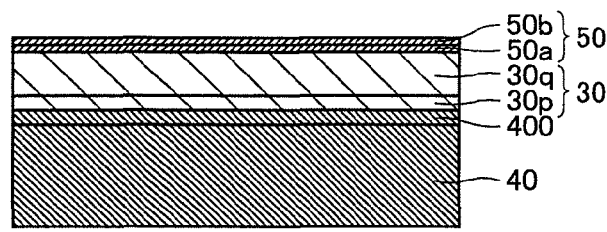
Figure 26:
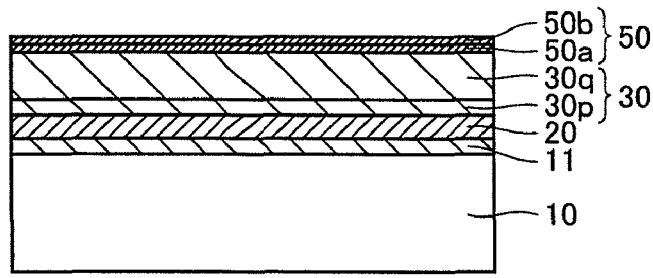
Figure 26:
Figure 26:
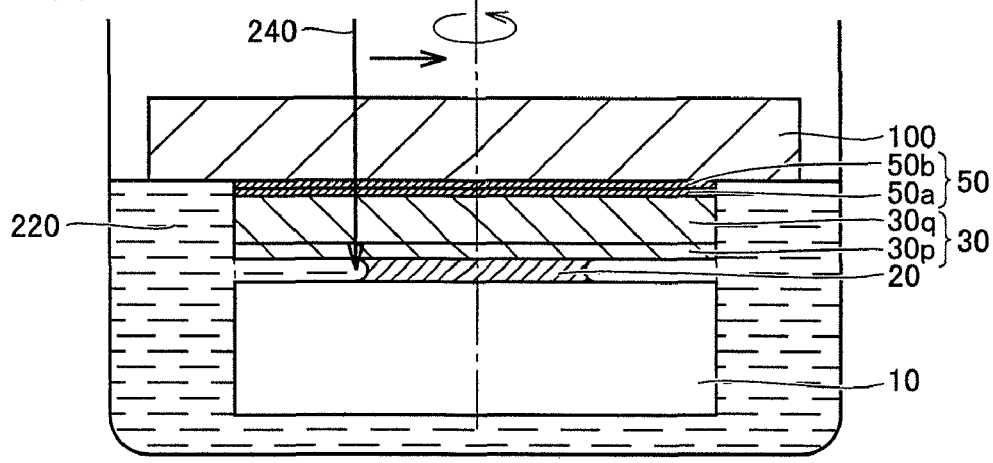
Figure 26:
Figure 26:
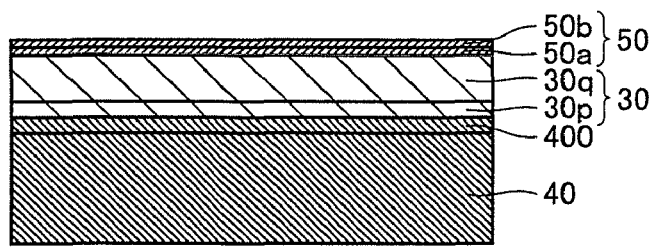

FIG. 22 is a schematic cross sectional view showing the latter half of steps of still another example method of manufacturing a nitride semiconductor device in accordance with the present invention, illustrating the steps of (A) removing the mask, (B) separating the nitride semiconductor epitaxial layer from the nitride semiconductor substrate, and (C) joining the separated nitride semiconductor epitaxial layer to the supporting substrate.

FIGS. 23 to 26 are schematic cross sectional views showing a yet another example method of manufacturing a nitride semiconductor device in accordance with the present invention, illustrating the steps of (A) growing the nitride semiconductor epitaxial layer, (B) separating the nitride semiconductor epitaxial layer from the nitride semiconductor substrate, and (C) joining the separated nitride semiconductor epitaxial layer to the supporting substrate.

DESCRIPTION OF THE PREFERRED EMBODIMENTS

First Embodiment

Embodiment of Method of Forming Nitride Semiconductor Epitaxial Layer

Figure 1:
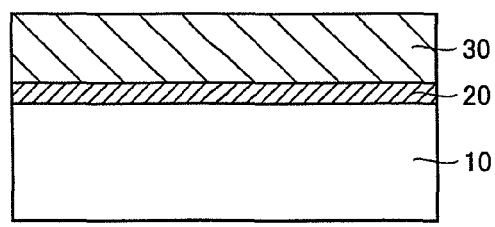
FIG. 1 is a schematic cross sectional view showing an embodiment of a method of forming a nitride semiconductor epitaxial layer and a method of manufacturing a nitride semiconductor device in accordance with the present invention, illustrating the steps of (A) growing the nitride semiconductor epitaxial layer, (B) separating the nitride semiconductor epitaxial layer from a nitride semiconductor substrate, (C) joining the separated nitride semiconductor epitaxial layer to a supporting substrate, and (D) reproducing the separated nitride semiconductor substrate.
Figure 1:
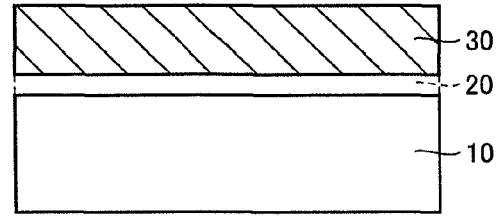
Figure 1:
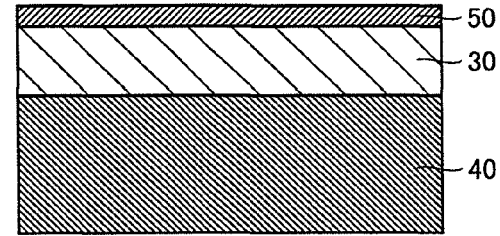
Figure 1:
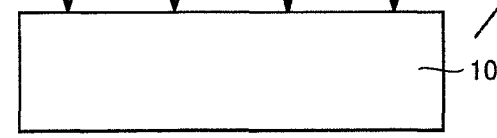

With reference to FIG. 1, a method of forming a nitride semiconductor epitaxial layer of this embodiment includes the steps of growing at least one layer of nitride semiconductor epitaxial layer 30 on a nitride semiconductor substrate 10 having a dislocation density lower than or equal to $1 \times 10^7$ $cm^{-2}$ with a chemical decomposition layer 20 interposed therebetween, chemical decomposition layer 20 being chemically decomposed at least with either a gas or an electrolytic solution (FIG. 1(A)), and decomposing chemical decomposition layer 20 at least with either the gas or the electrolytic solution either during or after the step of growing nitride semiconductor epitaxial layer 30, thereby separating nitride semiconductor epitaxial layer 30 from nitride semiconductor substrate 10 (FIG. 1(B)).

The method of forming a nitride semiconductor epitaxial layer of this embodiment decomposes chemical decomposition layer 20 at least with either the gas or the electrolytic solution, thereby separating nitride semiconductor epitaxial layer 30 from nitride semiconductor substrate 10, so that high-quality nitride semiconductor epitaxial layer 30 suffering less damage is obtained. The method of forming a nitride semiconductor epitaxial layer of this embodiment will be specifically described below.

(Step of Forming Nitride Semiconductor Epitaxial Layer)

With reference to FIG. 1(A), the method of forming a nitride semiconductor epitaxial layer of this embodiment includes the step of growing at least one layer of nitride semiconductor epitaxial layer 30 on nitride semiconductor substrate 10 having a dislocation density lower than or equal to $1 \times 10^7$ $cm^{-2}$ with chemical decomposition layer 20 interposed therebetween, chemical decomposition layer 20 being chemically decomposed at least with either a gas or an electrolytic solution. Through such a step, chemical decomposition layer 20 more likely to be chemically decomposed than nitride semiconductor epitaxial layer 30 and high-quality nitride semiconductor epitaxial layer 30 are obtained.

Herein, nitride semiconductor substrate 10 has a dislocation density lower than or equal to $1 \times 10^7$ cm$^{-2}$. When the dislocation density of nitride semiconductor substrate 10 is higher than $1 \times 10^7$ cm$^{-2}$, the dislocation density of nitride semiconductor epitaxial layer 30 grown on nitride semiconductor substrate 10 with chemical decomposition layer 20 interposed therebetween increases, so that part of nitride semiconductor epitaxial layer 30 having a higher dislocation density is decomposed when chemical decomposition layer 20 is decomposed. From this viewpoint, nitride semiconductor substrate 10 needs to have a dislocation density lower than or equal to $1 \times 10^7$ cm$^{-2}$, and a dislocation density lower than or equal to $1 \times 10^6$ cm$^{-2}$ is preferable.

Chemical decomposition layer 20 is not particularly limited only if it is more likely to be chemically decomposed at least with either a gas or an electrolytic solution than nitride semiconductor epitaxial layer 30, however, from the viewpoint of growing easy-to-decompose, high-quality nitride semiconductor epitaxial layer 30, a nitride semiconductor containing In (indium) is preferable. In the case where nitride semiconductor epitaxial layer 30 contains In, the In content of chemical decomposition layer 20 is preferably greater than that of nitride semiconductor epitaxial layer 30. From the viewpoint of suppressing decomposition of nitride semiconductor epitaxial layer 30, nitride semiconductor epitaxial layer 30 preferably contains a III-group element (e.g., Ga (gallium), Al (aluminum), etc.) other than In. To further facilitate decomposition of the chemical decomposition layer, the In (indium) composition relative to N (nitrogen) in the In-containing nitride semiconductor layer serving as the chemical decomposition layer is preferably more than or equal to 15 mol %. That is, the chemical decomposition layer is preferably an $In_xAl_yGa_{1-x-y}N$ layer ($0.15 \leq x \leq 1$, $0 \leq y \leq 1$, $0 \leq x+y \leq 1$) or the like.

With reference to FIG. 16, chemical decomposition layer 20 preferably has an In (indium) composition gradient structure in which, in chemical decomposition layer 20, the In (indium) composition relative to N (nitrogen) increases from a first main surface 20a to an inner portion 20c and decreases from inner portion 20c to a second main surface 20b. Chemical decomposition layer 20 having such an In composition gradient structure, which highly matches nitride semiconductor substrate 10 and nitride semiconductor epitaxial layer 30 in terms of lattice constant, suppresses the occurrence of distortions in nitride semiconductor epitaxial layer 30, and decomposition efficiently proceeds from a portion having a higher In composition.

Herein, contents of elements such as In, Ga, and Al in chemical decomposition layer 20 and nitride semiconductor epitaxial layer 30 as well as variations in In composition in the direction of thickness of the chemical decomposition layer can be measured by glow discharge optical spectroscopy, secondary ion mass spectroscopy (SIMS), or the like.

Chemical decomposition layer 20 is preferably a nitride semiconductor layer containing Al in addition to In. With reference to FIG. 17, as the In composition increases in the $In_xGa_{1-x}N$ semiconductor ($0 \leq x \leq 1$), the lattice constant thereof increases as compared to that of GaN crystals. Therefore, in the case where nitride semiconductor substrate 10 and/or nitride semiconductor epitaxial layer 30 are made of GaN semiconductor, mismatching in lattice constant between nitride semiconductor substrate 10 and/or nitride semiconductor epitaxial layer 30 and chemical decomposition layer 20 increases, degrading the crystallinity of nitride semiconductor epitaxial layer 30. An AlN semiconductor has a smaller lattice constant than GaN semiconductor and InN semiconductor. Therefore, the In-containing nitride semiconductor layer decreases in lattice constant by further containing Al, or mismatching in lattice constant between nitride semiconductor epitaxial layer 30 and chemical decomposition layer 20 can be reduced to improve the crystallinity of nitride semiconductor epitaxial layer 30.

From the above viewpoint, a difference in lattice constant between the chemical decomposition layer and the GaN semiconductor relative to the lattice constant of GaN semiconductor is preferably less than or equal to 1%. The chemical decomposition layer preferably has an In composition relative to N more than or equal to 15 mol % and less than or equal to 20 mol %. With reference to FIG. 17, for example, in the case where the chemical decomposition layer is made of an $In_xAl_{1-x}N$ semiconductor ($0 \leq x \leq 1$), the lattice constant of the chemical decomposition layer substantially matches that of GaN semiconductor when the In composition relative to N is 18 mol % (x=0.18). Therefore, the lattice constant of the chemical decomposition layer wherein the In composition relative to N is more than or equal to 15 mol % and less than or equal to 20 mol % makes a small difference from the lattice constant of the GaN semiconductor. The use of such a chemical decomposition layer ($In_xAl_{1-x}N$ ($0.15 \leq x \leq 0.20$) semiconductor layer) not only enables a high-quality GaN epitaxial layer to be obtained as a nitride semiconductor epitaxial layer, but also can suppress decomposition of the nitride semiconductor epitaxial layer to promote decomposition of the chemical decomposition layer by selection of the type of gas and/or electrolytic solution, because the chemical decomposition layer ($In_xAl_{1-x}N$ ($0.15 \leq x \leq 0.20$) semiconductor layer) and the nitride semiconductor epitaxial layer (GaN epitaxial layer) significantly differ in chemical properties.

Chemical decomposition layer 20 is not particularly limited only if it is more likely to be chemically decomposed at least with either a gas or an electrolytic solution than nitride semiconductor epitaxial layer 30, and any one of a metal layer, a metal oxide layer, and a silicon (Si)-containing layer can be used. As a metal layer, a molybdenum (Mo) layer, a titanium (Ti) layer, a tungsten (W) layer, or the like is suitably used. As a metal oxide layer, a zinc oxide (ZnO) layer or the like is suitably used. As a silicon-containing layer, a polycrystalline silicon layer, an amorphous silicon layer, a silicon oxide ($SiO_2$) layer, a silicon nitride ($Si_xN_y$) layer, or the like is suitably used.

The thickness of the chemical decomposition layer is not particularly limited, but is preferably more than or equal to 1 nm and less than or equal to 10 μm, and more preferably, more than or equal to 5 nm and less than or equal to 3 μm from the viewpoint of controlling the thickness to be more than or equal to a thickness that can provide sufficient contact with the gas and/or the electrolytic solution that decomposes the chemical decomposition layer, and to be less than or equal to a thickness that requires less time for forming and decomposing the chemical decomposition layer.

The dislocation density of the nitride semiconductor epitaxial layer to be grown is preferably lower than or equal to $1 \times 10^7$ cm$^{-2}$, and more preferably less than or equal to $1 \times 10^6$ cm$^{-2}$ from the viewpoint of suppressing decomposition of the nitride semiconductor epitaxial layer with the gas or the electrolytic solution.

The thickness of the nitride semiconductor epitaxial layer is not particularly limited, however, the nitride semiconductor epitaxial layer separated from the nitride semiconductor substrate preferably has a thickness more than or equal to 3 μm and less than or equal to 100 μm from the viewpoint of manufacturing a power device having a high withstand voltage (high withstand electric voltage; hereinafter the same applies) and a low on-resistance as a nitride semiconductor device.

The nitride semiconductor epitaxial layer to be grown is not particularly limited, however, the nitride semiconductor epitaxial layer when separated from the nitride semiconductor substrate preferably includes a layer having a thickness more than or equal to 3 μm and less than or equal to 20 μm and a carrier concentration less than or equal to $2\times10^{16}$ cm$^{-3}$ from the viewpoint of manufacturing a drift layer of a power device having a high withstand voltage and a low on-resistance as a nitride semiconductor device.

With reference to FIGS. 18A to 18C, from the viewpoint of promoting decomposition of the chemical decomposition layer when brought into contact with the electrolytic solution, which will be described later, it is preferable in the step of growing nitride semiconductor epitaxial layer 30 to form a hole supply layer 25 that supplies holes to chemical decomposition layer 20 in proximity to chemical decomposition layer 20 and between nitride semiconductor substrate 10 and nitride semiconductor epitaxial layer 30. Herein, hole supply layer 25 may be located between nitride semiconductor substrate 10 and chemical decomposition layer 20 (FIG. 18A) or between chemical decomposition layer 20 and nitride semiconductor epitaxial layer 30 (FIG. 18B), or both between nitride semiconductor substrate 10 and chemical decomposition layer 20 and between chemical decomposition layer 20 and nitride semiconductor epitaxial layer 30 (FIG. 18C).

Herein, hole supply layer 25 is not particularly limited only if it can supply holes to chemical decomposition layer 20, however, from the viewpoint of growing high-quality nitride semiconductor epitaxial layer 30, a nitride semiconductor layer is preferable, and is preferably implemented by, for example, a stack of GaN layer/Al$_x$Ga$_{1-x}$N layer (0<x<1)/GaN layer, and the like.

From the viewpoint of growing high-quality nitride semiconductor epitaxial layer 30, a buffer layer may be formed between the nitride semiconductor substrate and the chemical decomposition layer or the hole supply layer.

From the viewpoint of manufacturing a high-performance semiconductor device (particularly, a power device), nitride semiconductor substrate 10 is preferably a GaN substrate, and nitride semiconductor epitaxial layer 30 is preferably a GaN epitaxial layer.

In the step of growing the nitride semiconductor epitaxial layer, the technique for growing the nitride semiconductor epitaxial layer, the chemical decomposition layer, the hole supply layer, and the buffer layer is not particularly limited, however, from the viewpoint of growing a high-quality nitride semiconductor epitaxial layer, a gas phase process such as a MOCVD (Metal Organic Chemical Vapor Deposition) process or the like is preferably used.

(Step of Separating Nitride Semiconductor Epitaxial Layer from Nitride Semiconductor Substrate)

With reference to FIG. 1(B), the method of forming the nitride semiconductor epitaxial layer of the present embodiment includes the step of decomposing chemical decomposition layer 20 at least with either the gas or the electrolytic solution either during or after the step of growing nitride semiconductor epitaxial layer 30, thereby separating nitride semiconductor epitaxial layer 30 from nitride semiconductor substrate 10. Through such a step, nitride semiconductor epitaxial layer 30 is separated from nitride semiconductor substrate 10 with little damage to nitride semiconductor epitaxial layer 30, so that high-quality nitride semiconductor epitaxial layer 30 can be obtained.

Herein, to decompose the chemical decomposition layer, at least either a gas or an electrolytic solution is used. Herein, the gas is not particularly limited only if it can decompose the chemical decomposition layer, and can include a gas containing a hydrogen gas, an ammonia gas, a hydrogen chloride gas, a chlorine gas, or the like, however, a gas containing at least either a hydrogen gas or an ammonia gas is preferably used from the viewpoint of suppressing decomposition of the nitride semiconductor epitaxial layer with the gas to improve the selectivity of decomposition of the chemical decomposition layer.

The electrolytic solution is not particularly limited only if it can decompose the chemical decomposition layer, and a solution containing an alkali such as potassium hydroxide (KOH) or sodium hydroxide (NaOH), a solution containing such an alkali and an oxidant such as hydrogen peroxide (H$_2$O$_2$), or the like is used. Herein, the electrolytic solution preferably contains at least one of a chemical substance that promotes decomposition of the chemical decomposition layer and a chemical substance that suppresses decomposition of the nitride semiconductor epitaxial layer from the viewpoint of improving selectivity of decomposition of the chemical decomposition layer by suppression of decomposition of the nitride semiconductor epitaxial layer and/or by promotion of decomposition of the chemical decomposition layer. The chemical substance that promotes decomposition of the chemical decomposition layer includes a compound selectively coordinated to ions of indium (In), one of constituents of the chemical decomposition layer, for example, dimethylamine, ethylenediaminetetraacetic acid, and the like. Herein, the compound selectively coordinated to In ions represents a compound more likely to be coordinated to In ions than a III-group element other than In. The chemical substance that suppresses decomposition of the nitride semiconductor epitaxial layer includes a chemical substance containing ions of gallium (Ga) or aluminum (Al), one of constituents of the nitride semiconductor epitaxial layer, for example, gallium hydroxide (Ga(OH)$_3$), aluminum hydroxide (Al(OH)$_3$), or the like. For example, in the case where nitride semiconductor substrate 10 is a GaN substrate and nitride semiconductor epitaxial layer 30 is a GaN epitaxial layer, the use of an electrolytic solution containing Ga ions can suppress decomposition of the GaN substrate and the GaN epitaxial layer. Decomposition of the chemical decomposition layer will be specifically described below.

(Decomposition of Chemical Decomposition Layer with Gas)

Figure 2:
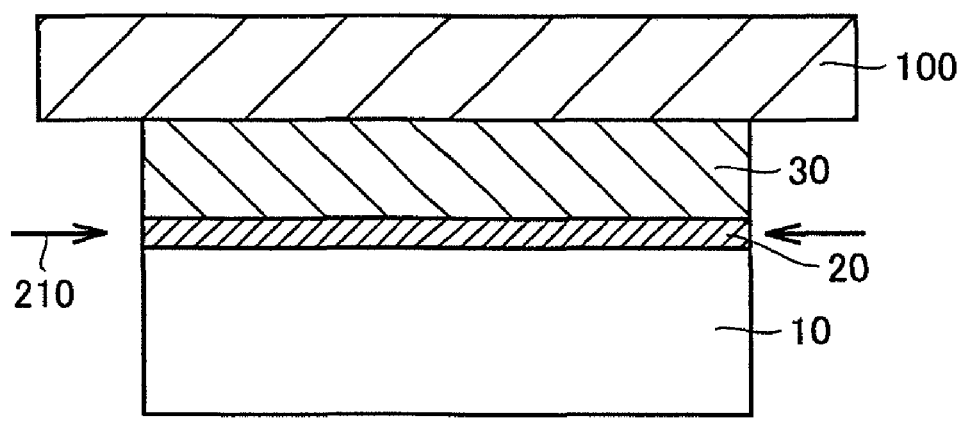
FIG. 2 is a schematic cross sectional view showing a method of decomposing the chemical decomposition layer by bringing the chemical decomposition layer into contact with a gas, illustrating (A) a state before the chemical decomposition layer is decomposed, and (B) a state after the chemical decomposition layer has been decomposed.
Figure 2:
Figure 2:
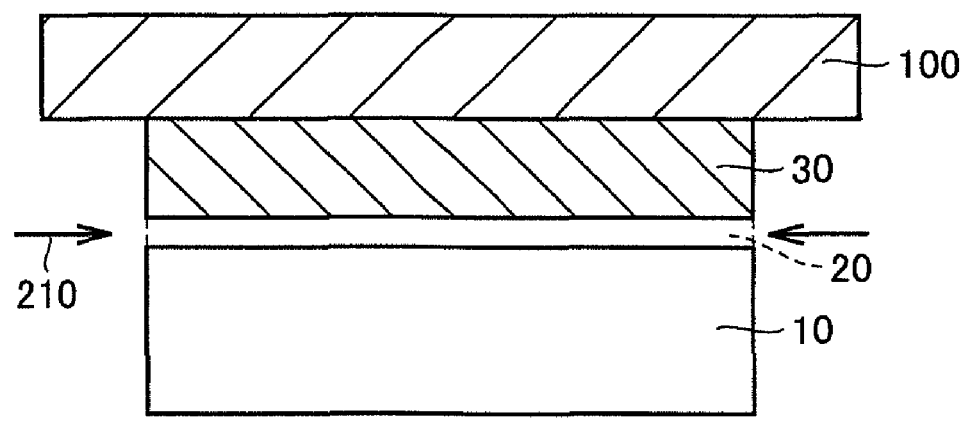

With reference to FIG. 2, decomposition of chemical decomposition layer 20 with a gas 210 can be performed by bringing chemical decomposition layer 20 into contact with gas 210 containing at least either a hydrogen gas or an ammonia gas either during or after the step of growing the nitride semiconductor epitaxial layer.

With reference to FIG. 2(A), nitride semiconductor epitaxial layer 30 grown on nitride semiconductor substrate 10 with chemical decomposition layer 20 interposed therebetween is temporarily supported on a temporary supporting base material 100 with an adhesive or the like, and then chemical decomposition layer 20 is brought into contact with gas 210 containing at least either a hydrogen gas or an ammonia gas. With reference to FIG. 2(B), chemical decomposition layer 20 is thereby decomposed with gas 210 containing at least either a hydrogen gas or an ammonia gas, so that nitride semiconductor epitaxial layer 30 is separated from nitride semiconductor substrate 10.

In decomposition of the chemical decomposition layer with a gas, in the step of growing the nitride semiconductor epitaxial layer, the chemical decomposition layer can also be grown at an ambient temperature less than or equal to 900° C., and the chemical decomposition layer can be decomposed at an ambient temperature more than or equal to 1000° C. Such a method enables growth of the nitride semiconductor epitaxial layer and at least partial decomposition (e.g., increase of holes, etc.) of the chemical decomposition layer, during the step of growing the nitride semiconductor epitaxial layer.

(Decomposition of Chemical Decomposition Layer with Electrolytic Solution)

Figure 3:
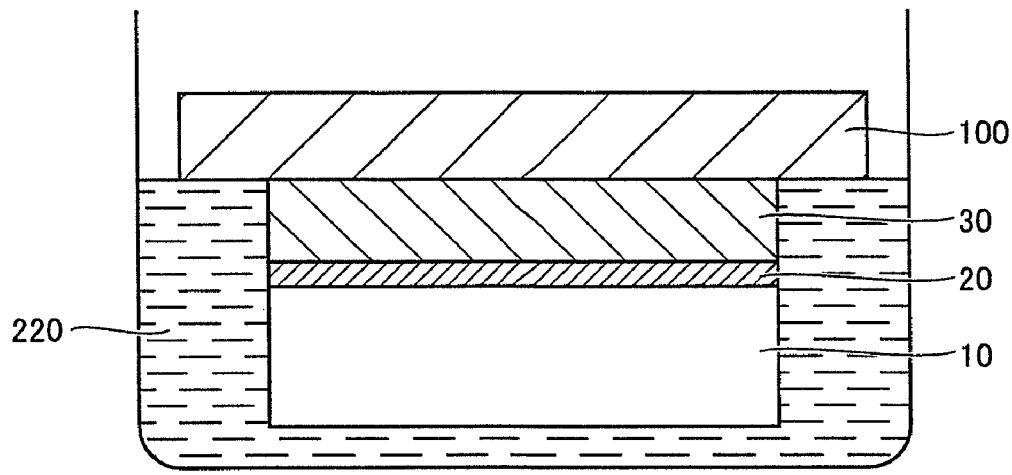
FIG. 3 is a schematic cross sectional view showing a method of decomposing the chemical decomposition layer by bringing the chemical decomposition layer into contact with an electrolytic solution, illustrating (A) a state before the chemical decomposition layer is decomposed, and (B) a state after the chemical decomposition layer has been decomposed.
Figure 3:
Figure 3:
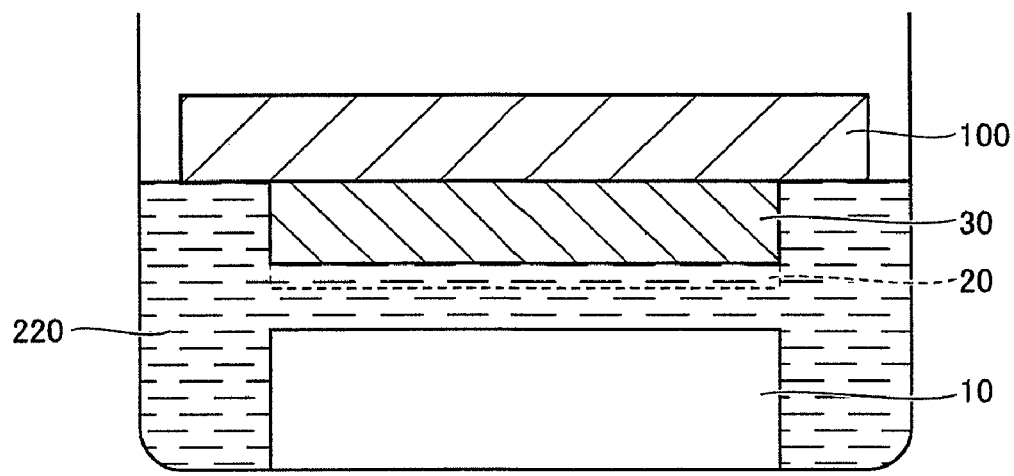

With reference to FIG. 3, decomposition of chemical decomposition layer 20 with an electrolytic solution 220 can be performed by bringing chemical decomposition layer 20 into contact with electrolytic solution 220 after the step of growing the nitride semiconductor epitaxial layer.

Herein, the electrolytic solution represents, in a broad sense, a solution having electric conductivity produced by dissolving an ionic substance into a polar solvent such as water, and includes, for example, a solution containing an alkali such as potassium hydroxide (KOH) or sodium hydroxide (NaOH), a solution containing such an alkali and an oxidant such as hydrogen peroxide ($H_2O_2$), a solution containing such an alkali and a chemical substance that promotes decomposition of the chemical decomposition layer (dimethylamine, ethylenediaminetetraacetic acid, etc.), a solution containing such an alkali and a chemical substance that suppresses decomposition of the nitride semiconductor epitaxial layer (gallium hydroxide, aluminum hydroxide, etc.), and the like.

The electrolytic solution containing an oxidant promotes decomposition of the chemical decomposition layer by the action of oxidation of the oxidant. The electrolytic solution containing a chemical substance that promotes decomposition of the chemical decomposition layer promotes escape of indium as ions from the chemical decomposition layer into the electrolytic solution to promote decomposition of the chemical decomposition layer, because such a chemical substance is selectively coordinated to ions of indium, one of constituents of the chemical decomposition layer, thereby reducing the concentration of non-coordinated indium ions in the electrolytic solution as compared to a chemical equilibrium concentration. The electrolytic solution containing a chemical substance that suppresses decomposition of the nitride semiconductor epitaxial layer suppresses escape of gallium or aluminum as ions from the nitride semiconductor epitaxial layer into the electrolytic solution to suppress decomposition of the nitride semiconductor epitaxial layer, because such a chemical substance is dissociated into ions of gallium (Ga) or aluminum (Al), one of constituents of the nitride semiconductor epitaxial layer, in the electrolytic solution, thereby increasing the concentration of these ions as compared to the chemical equilibrium concentration.

The technique for bringing at least chemical decomposition layer 20 into contact with the electrolytic solution specifically includes, with reference to FIG. 3(A), a technique for temporarily supporting nitride semiconductor epitaxial layer 30 grown on nitride semiconductor substrate 10 with chemical decomposition layer 20 interposed therebetween, on temporary supporting base material 100 with an adhesive or the like, and then immersing the above-mentioned nitride semiconductor substrate 10, chemical decomposition layer 20, and nitride semiconductor epitaxial layer 30 into electrolytic solution 220. With reference to FIG. 3(B), chemical decomposition layer 20 is thereby decomposed with electrolytic solution 220, so that nitride semiconductor epitaxial layer 30 is separated from nitride semiconductor substrate 10.

With reference to FIGS. 3 and 18, in decomposition of the chemical decomposition layer with the electrolytic solution, it is preferable to form hole supply layer 25 that supplies holes to chemical decomposition layer 20 in proximity to chemical decomposition layer 20 and between nitride semiconductor substrate 10 and nitride semiconductor epitaxial layer 30. This is because the supply of holes from hole supply layer 25 to chemical decomposition layer 20 promotes decomposition of chemical decomposition layer 20 in decomposition of the chemical decomposition layer with the electrolytic solution.

Figure 4:
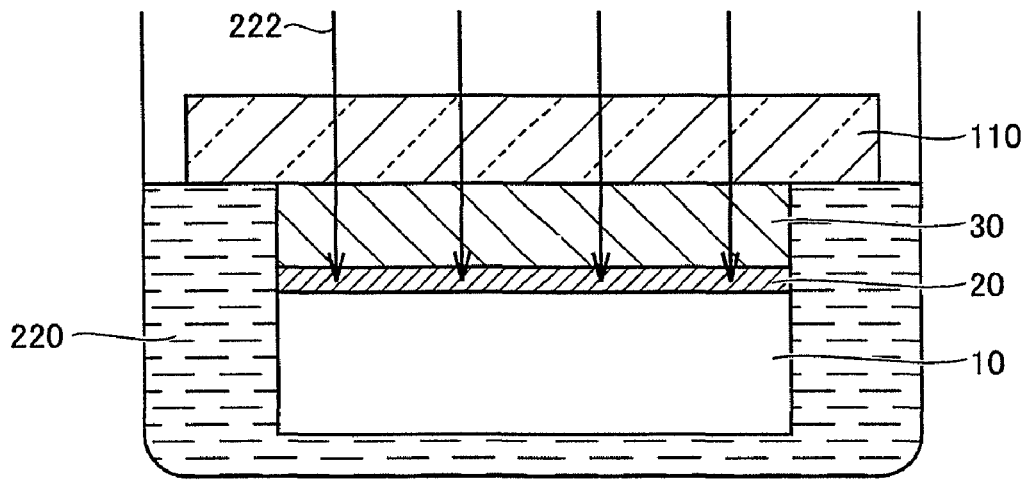
FIG. 4 is a schematic cross sectional view showing a method of decomposing the chemical decomposition layer by irradiating the chemical decomposition layer with light while the chemical decomposition layer is in contact with the electrolytic solution, illustrating (A) a state before the chemical decomposition layer is decomposed, and (B) a state after the chemical decomposition layer has been decomposed.
Figure 4:
Figure 4:
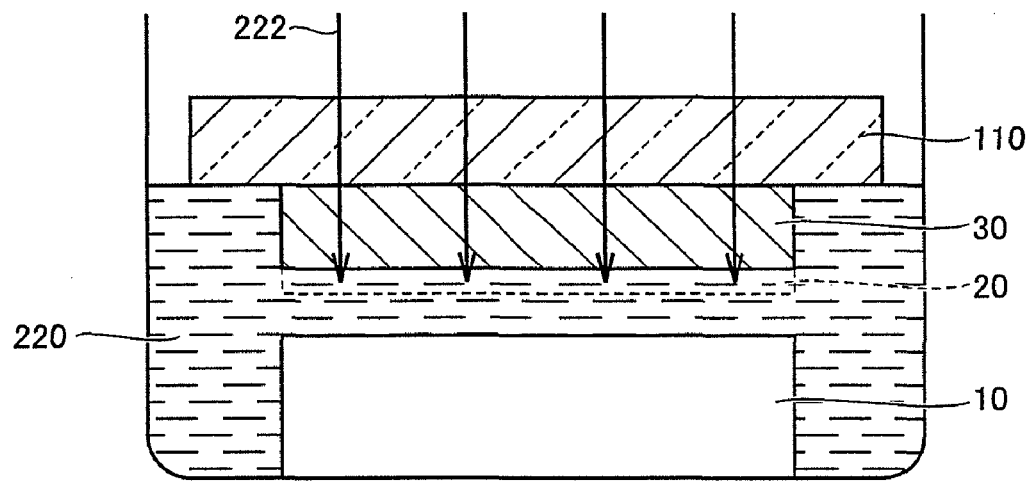

With reference to FIG. 4, in decomposition of the chemical decomposition layer with the electrolytic solution, chemical decomposition layer 20 is preferably irradiated with light 222 while chemical decomposition layer 20 is in contact with electrolytic solution 220. This is because photoexcitation induces the holes, which promotes decomposition of chemical decomposition layer 20. Light 222 varies in wavelength depending on the chemical decomposition layer, and can be effectively separated from light having a wavelength corresponding to bandgap energy of the chemical decomposition layer. Herein, from the viewpoint of improving the irradiation efficiency of light 222 to chemical decomposition layer 20, a material of high optical transmittance, for example, a transparent material is suitably used as temporary supporting base material 110.

Figure 5:
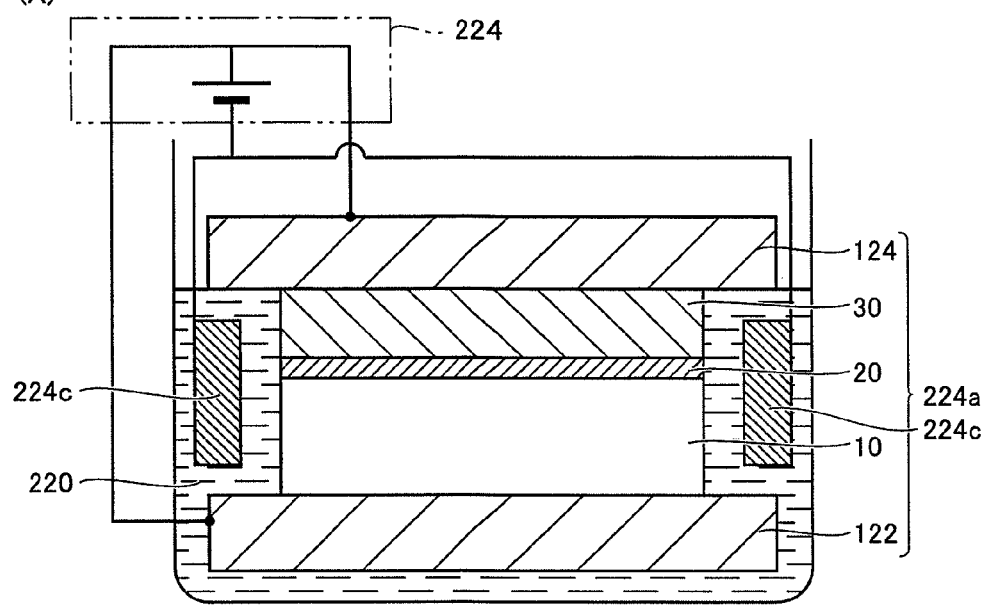
FIG. 5 is a schematic cross sectional view showing a method of decomposing the chemical decomposition layer by locating a cathode in the electrolytic solution and applying a voltage across the chemical decomposition layer and the cathode such that the chemical decomposition layer serves as an anode while at least the chemical decomposition layer is in contact with the electrolytic solution, illustrating (A) a state before the chemical decomposition layer is decomposed, and (B) a state after the chemical decomposition layer has been decomposed.
Figure 5:
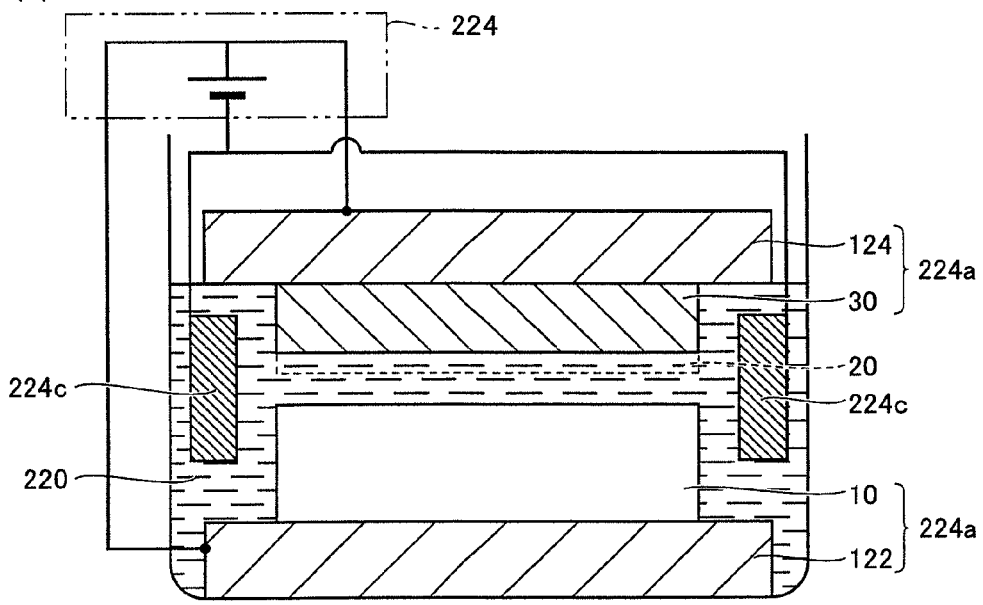

With reference to FIG. 5, in decomposition of the chemical decomposition layer with the electrolytic solution, it is preferable to locate a cathode 224c in electrolytic solution 220 and to apply a voltage across chemical decomposition layer 20 and cathode 224c in chemical decomposition layer 20 such that chemical decomposition layer 20 serves as an anode 224a, while at least chemical decomposition layer 20 is in contact with electrolytic solution 220. This is because the application of such a voltage causes holes to be supplied to chemical decomposition layer 20, which promotes decomposition of chemical decomposition layer 20 in decomposition of the chemical decomposition layer with the electrolytic solution.

Specifically, with reference to FIG. 5(A), a temporary supporting base material 122 in contact with and temporarily supporting nitride semiconductor substrate 10 of nitride semiconductor epitaxial layer 30 grown on nitride semiconductor substrate 10 with chemical decomposition layer 20 interposed therebetween and a temporary supporting base material 124 in contact with and temporarily supporting nitride semiconductor epitaxial layer 30 are used as anode 224a, and cathode 224c is located in electrolytic solution 220, and a voltage is applied across anode 224a and cathode 224c by a voltage application device 224. At this time, temporary supporting base material 122, nitride semiconductor substrate 10, chemical decomposition layer 20, nitride semiconductor epitaxial layer 30, and temporary supporting substrate 124 all serve as anode 224a. With reference to FIG. 5(B), the application of such a voltage thereby efficiently decomposes chemical decomposition layer 20 in the vicinity of electrolytic solution 220 serving as a cathode portion, so that nitride semiconductor epitaxial layer 30 is separated from nitride semiconductor substrate 10. Herein, from the viewpoint of applying a voltage across chemical decomposition layer 20 and cathode 224c in electrolytic solution 220, conductive temporary supporting base materials 122 and 124 are suitably used.

It should be noted that, in FIG. 5, temporary supporting base material 122 in contact with and temporarily supporting nitride semiconductor substrate 10 and temporary supporting base material 124 in contact with and temporarily supporting nitride semiconductor epitaxial layer 30 both serve as anode 224a, however, a similar effect is also obtained when either one of these temporary supporting base materials 122 and 124 serves as anode 224a.

Figure 6:
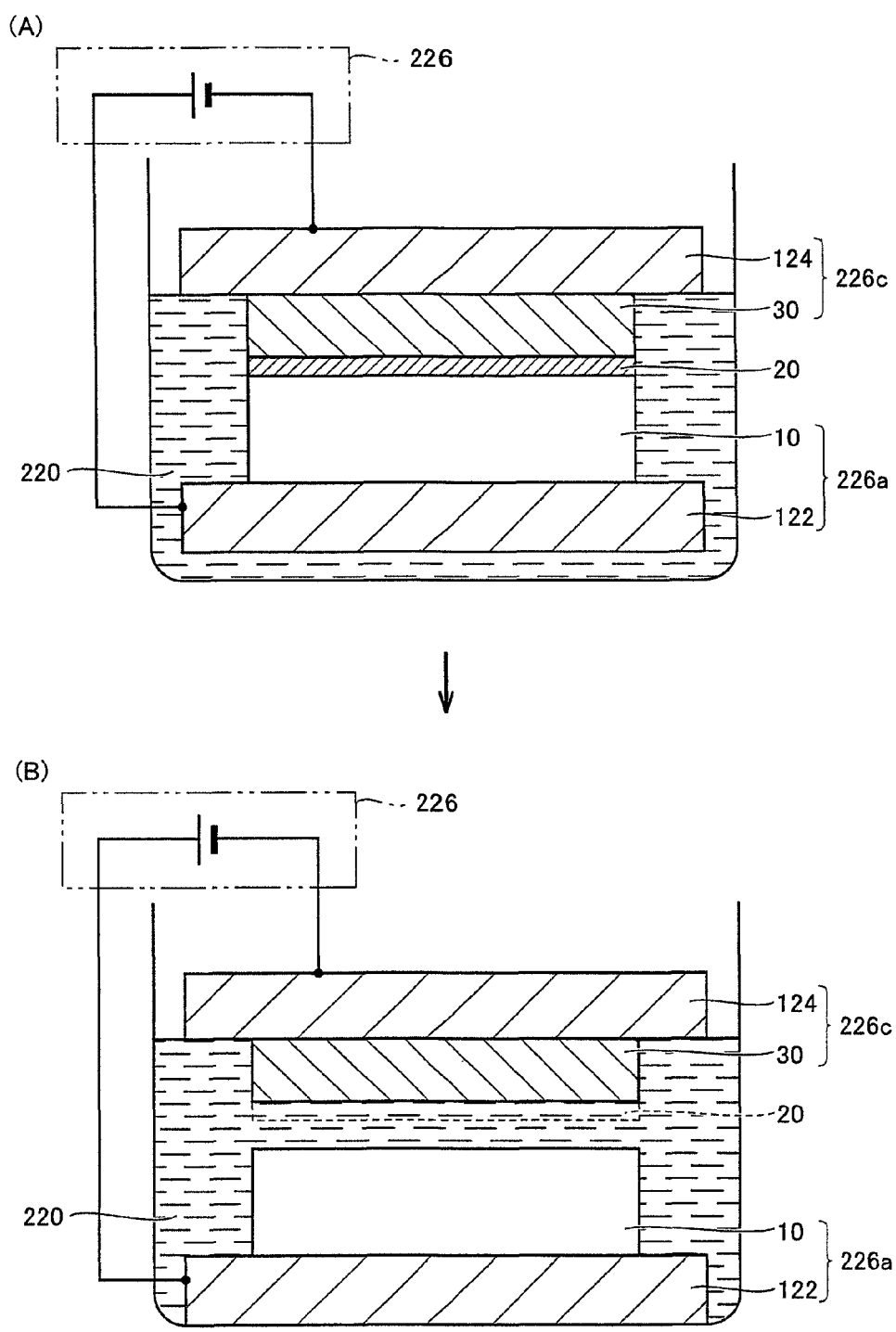
FIG. 6 is a schematic cross sectional view showing a method of decomposing the chemical decomposition layer by applying a voltage across the nitride semiconductor substrate and the nitride semiconductor epitaxial layer such that the nitride semiconductor substrate serves as an anode and the nitride semiconductor epitaxial layer serves as a cathode while the nitride semiconductor substrate, the chemical decomposition layer, and the nitride semiconductor epitaxial layer are in contact with the electrolytic solution, illustrating (A) a state before the chemical decomposition layer is decomposed, and (B) a state after the chemical decomposition layer has been decomposed.

With reference to FIG. 6, in decomposition of the chemical decomposition layer with the electrolytic solution, it is preferable to apply a voltage across nitride semiconductor substrate 10 and nitride semiconductor epitaxial layer 30 such that nitride semiconductor substrate 10 serves as an anode 226a and nitride semiconductor epitaxial layer 30 serves as a cathode 226c, while nitride semiconductor substrate 10, chemical decomposition layer 20, and nitride semiconductor epitaxial layer 30 are in contact with electrolytic solution 220. This is because the application of such a voltage causes holes to be supplied to chemical decomposition layer 20, which promotes decomposition of chemical decomposition layer 20 in decomposition of chemical decomposition layer 20 with electrolytic solution 220, and because nitride semiconductor epitaxial layer 30 after decomposition of chemical decomposition layer 20 serves as cathode 226c, which suppresses decomposition of nitride semiconductor epitaxial layer 30.

Specifically, with reference to FIG. 6(A), temporary supporting base material 122 in contact with and temporarily supporting nitride semiconductor substrate 10 of nitride semiconductor epitaxial layer 30 grown on nitride semiconductor substrate 10 with chemical decomposition layer 20 interposed therebetween is used as anode 226a, and temporary supporting base material 124 in contact with and temporarily supporting nitride semiconductor epitaxial layer 30 is used as cathode 226c, and a voltage is applied across anode 226a and cathode 226c by a voltage application device 226. At this time, temporary supporting base material 122 and nitride semiconductor substrate 10 serve as anode 226a, and temporary supporting base material 124 and nitride semiconductor epitaxial layer 30 serve as cathode 226c. With reference to FIG. 6(B), the application of such a voltage thereby efficiently decomposes chemical decomposition layer 20 while decomposition of nitride semiconductor epitaxial layer 30 serving as a cathode portion is suppressed, so that nitride semiconductor epitaxial layer 30 is separated from nitride semiconductor substrate 10. Decomposition of nitride semiconductor epitaxial layer 30 serving as the cathode portion by the action of cathode 226c is also suppressed after the separation.

With reference to FIGS. 4 to 6, it is preferable to produce a liquid flow in electrolytic solution 220 to bring the liquid flow into contact with chemical decomposition layer 20 such that chemical decomposition layer 20 is efficiently in contact with electrolytic solution 220.

(Decomposition of Chemical Decomposition Layer with Gas and Electrolytic Solution)

Decomposition of the chemical decomposition layer with a gas and an electrolytic solution can be performed by bringing the chemical decomposition layer into contact with the gas of at least either a hydrogen gas or an ammonia gas during the step of growing the nitride semiconductor epitaxial layer, and by bringing the chemical decomposition layer into contact with the electrolytic solution after the step of growing the nitride semiconductor epitaxial layer. According to such a decomposition method, the chemical decomposition layer can be efficiently decomposed with the above-mentioned gas during the step of growing the nitride semiconductor epitaxial layer, and with the above-mentioned electrolytic solution after the step of growing nitride semiconductor epitaxial layer. Herein, advantages of decomposition of the chemical decomposition layer with the gas and those of decomposition of the chemical decomposition layer with the electrolytic solution in accordance with the present decomposition method can be both utilized.

The nitride semiconductor epitaxial layer separated as described above preferably has a thickness more than or equal to 3 µm and less than or equal to 100 µm from the viewpoint of manufacturing a power device having a high withstand voltage and a low on-resistance as a nitride semiconductor device.

The nitride semiconductor epitaxial layer separated as described above preferably includes a layer having a thickness more than or equal to 3 µm and less than or equal to 20 µm and a carrier concentration less than or equal to $2 \times 10^{16}$ cm$^{-3}$ when separated from the nitride semiconductor substrate from the viewpoint of manufacturing a drift layer of a power device having a high withstand voltage and a low on-resistance as a nitride semiconductor device.

(Decomposition of Chemical Decomposition Layer At Least with Either Gas or Electrolytic Solution and Further by Applying Stress At Least to Part of Chemical Decomposition Layer)

Figure 7:
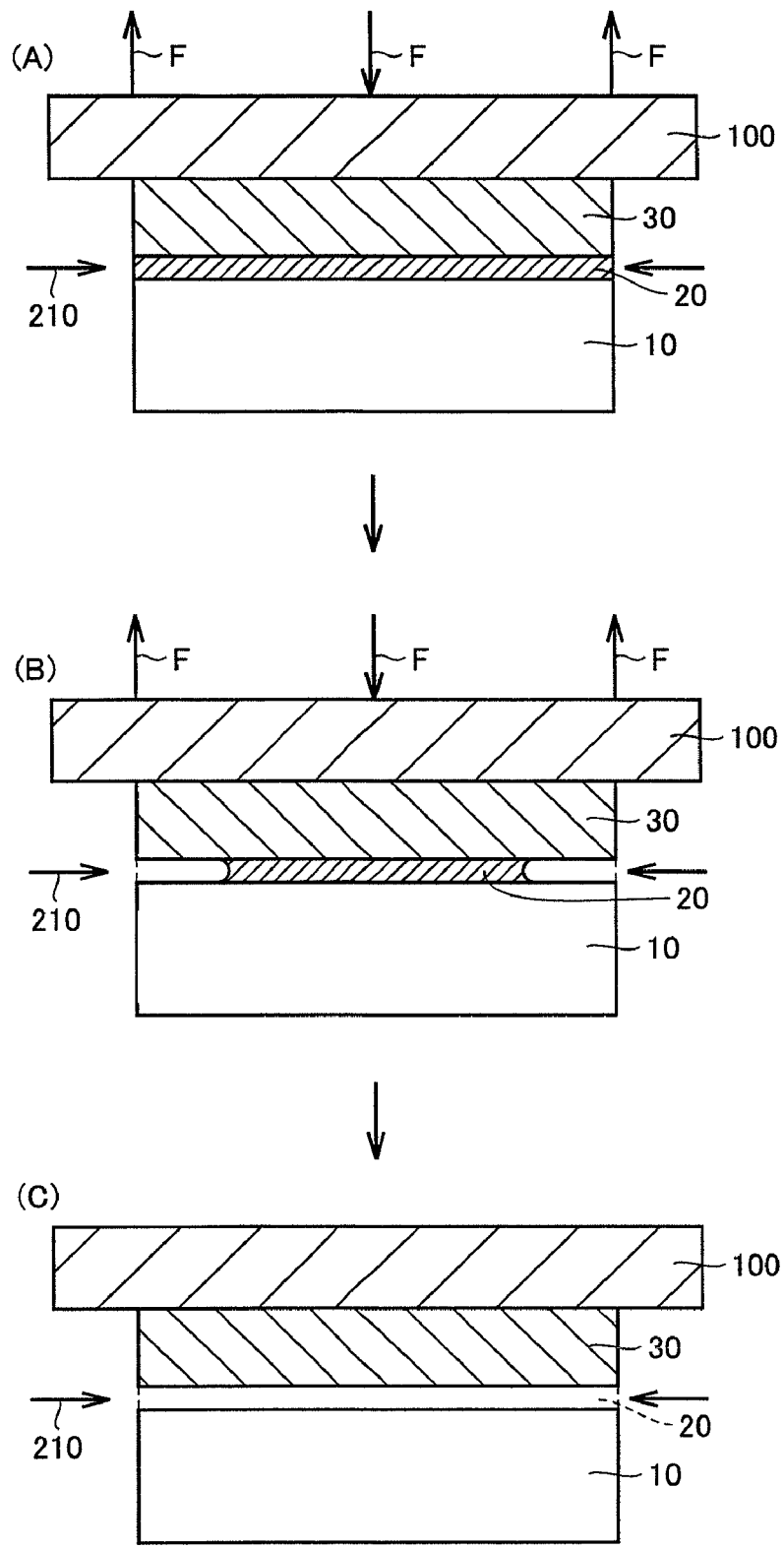
FIG. 7 is a schematic cross sectional view showing a method of decomposing the chemical decomposition layer with the gas and further by applying a stress at least to part of the chemical decomposition layer, illustrating (A) a state before the chemical decomposition layer is decomposed, (B) a state while the chemical decomposition layer is decomposed, and (C) a state after the chemical decomposition layer has been decomposed.
Figure 8:
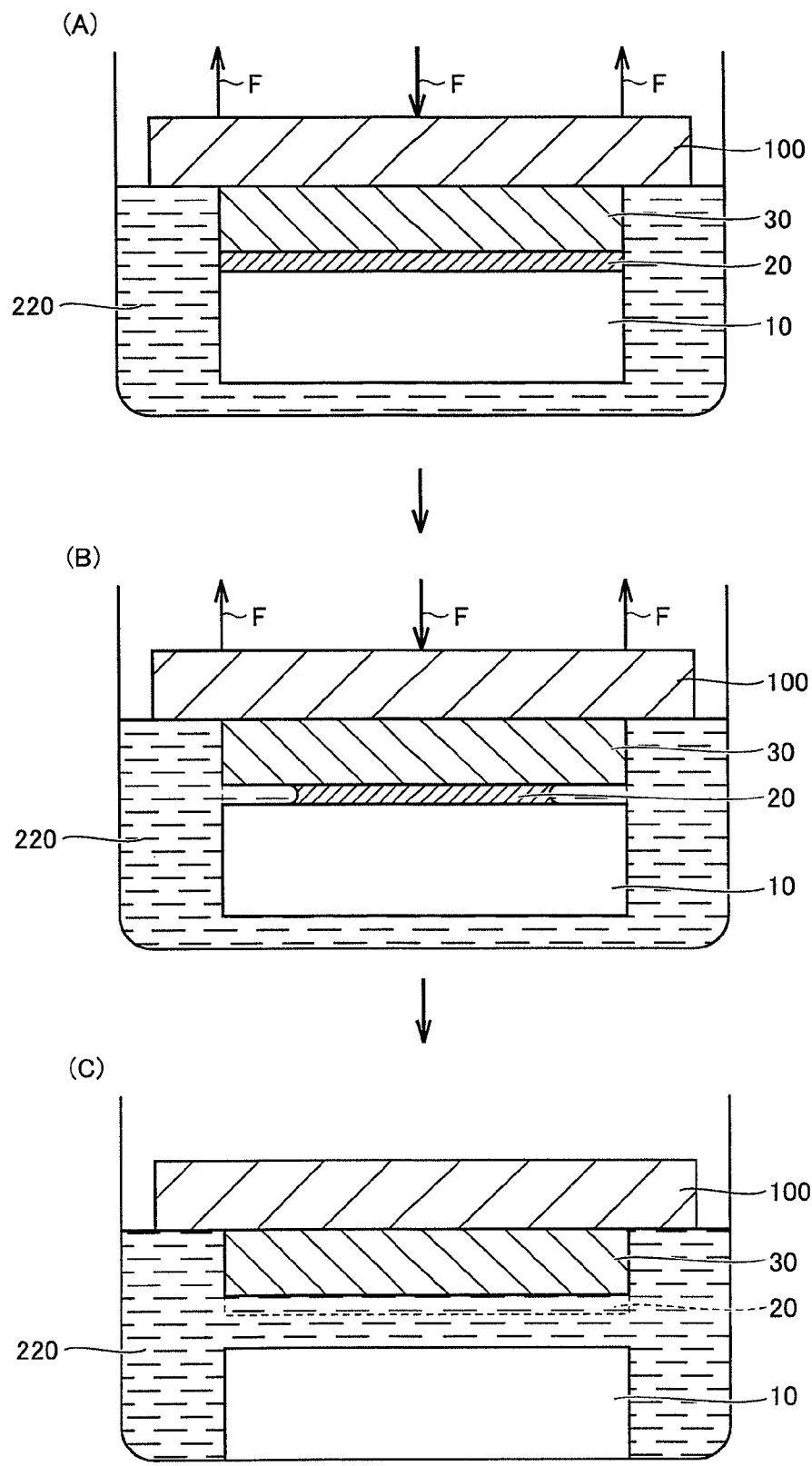
FIG. 8 is a schematic cross sectional view showing a method of decomposing the chemical decomposition layer with the electrolytic solution and further by applying a stress at least to part of the chemical decomposition layer, illustrating (A) a state before the chemical decomposition layer is decomposed, (B) a state while the chemical decomposition layer is decomposed, and (C) a state after the chemical decomposition layer has been decomposed.
Figure 9:
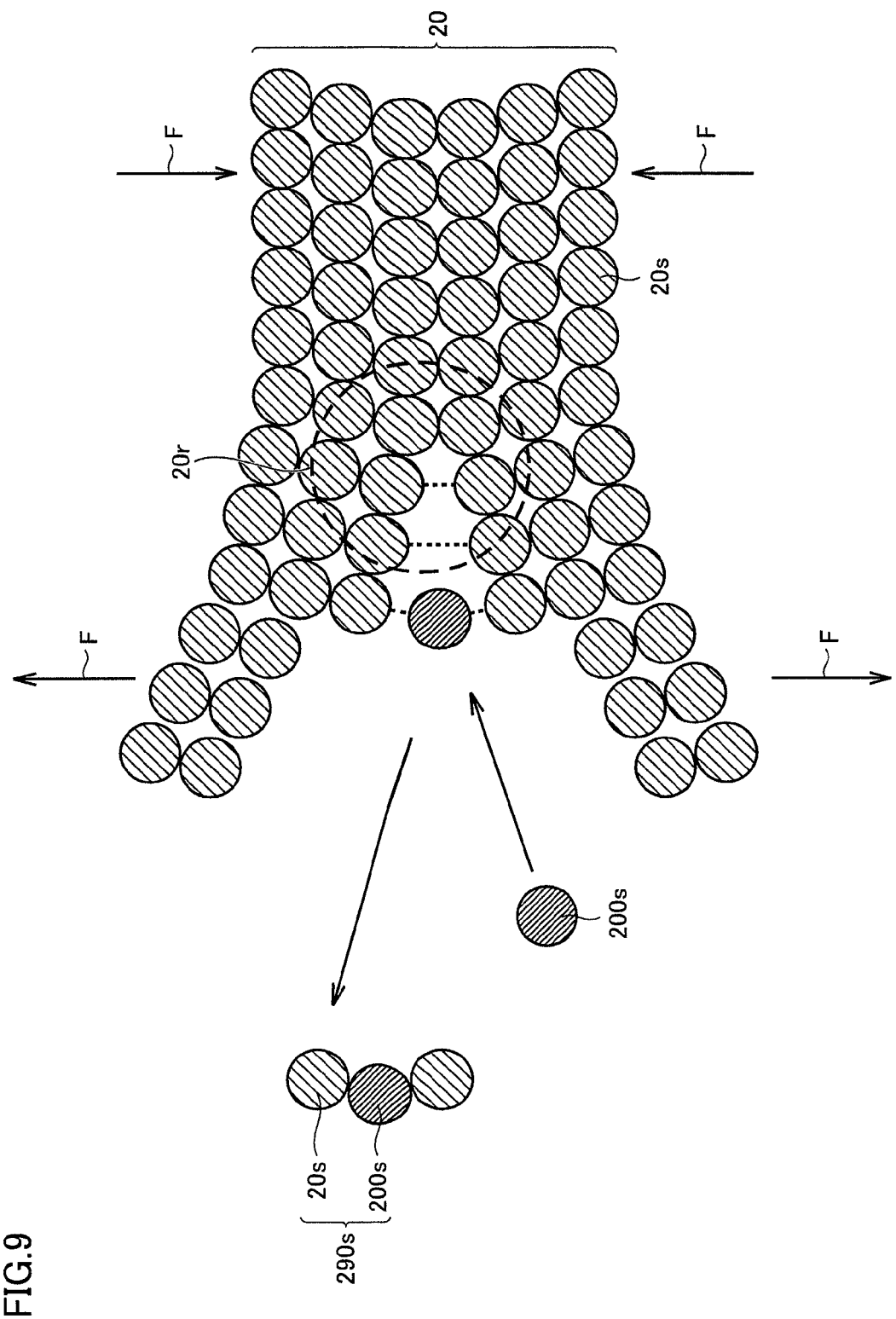
FIG. 9 is a schematic cross sectional view showing a mechanism of decomposition of the chemical decomposition layer in the method of decomposing the chemical decomposition layer at least with either the gas or the electrolytic solution and further by applying a stress at least to part of the chemical decomposition layer.

With reference to FIGS. 7 to 9, decomposition of chemical decomposition layer 20 at least with either gas 210 or electrolytic solution 220 can be performed further by applying a stress F at least to part of chemical decomposition layer 20. Stress F is applied at least to part of chemical decomposition layer 20, so that stress F is concentrated on at least the part of chemical decomposition layer 20 to promote chemical decomposition of that part.

With reference to FIGS. 7(A), 8(A) and 9, the technique for applying stress F to chemical decomposition layer 20 and the part to which stress F is applied are not particularly limited, however, for example, nitride semiconductor epitaxial layer 30 grown on nitride semiconductor substrate 10 with chemical decomposition layer 20 interposed therebetween is temporarily supported by temporary supporting base material 100 with an adhesive or the like, following which at least chemical decomposition layer 20 is placed in an atmosphere of gas 210 or electrolytic solution 220, and a compression stress can be applied to the central part of this temporary supporting base material 100, and a tensile stress can be applied to the peripheral part (that is, in FIGS. 7 to 9, a shearing stress can be applied to a main surface of temporary supporting base material 100 such that the central part thereof projects downwardly). The technique for applying the above-mentioned stress to temporary supporting base material 100 is not particularly limited, and for example, stress F that presses down the central part of temporary supporting base material 100 and stress F that pulls up the peripheral part can be applied.

Since chemical decomposition layer 20 has a smaller rigidity than proximate nitride semiconductor epitaxial layer 30 and nitride semiconductor substrate 10, when the above-mentioned stress F is applied to temporary supporting base material 100, in FIGS. 7 to 9, stress F is applied to a main surface of chemical decomposition layer 20 in contact with nitride semiconductor epitaxial layer 30 such that the central part of the main surface projects downwardly, and by means of reaction against such a stress, a shearing stress is applied to a main surface of chemical decomposition layer 20 in contact with nitride semiconductor substrate 10 such that the central part of the main surface projects upwardly, so that a compression stress is applied to the central part of chemical decomposition layer 20, and a tensile stress is applied to the outer peripheral part.

With reference to FIG. 9, when the above-mentioned stresses F are applied to chemical decomposition layer 20, a stress-concentrated region is formed at the outer peripheral part of chemical decomposition layer 20. In such a stress-concentrated region, bonding among chemical species 20s constituting chemical decomposition layer 20 is weakened. Chemical species 200s of gas 210 or electrolytic solution 220 are brought into contact and react with chemical species 20s whose bonding among chemical species 20s has been weakened, so that a reaction product 290s is produced. Decomposition of chemical decomposition layer 20 is thereby promoted in the stress-concentrated region. That is, the stress-concentrated region of chemical decomposition layer 20 corresponds to a decomposition-promoted region 20r, and chemical decomposition layer 20 is efficiently decomposed in decomposition-promoted region 20r.

Herein, although not particularly limited, the stress applied to the chemical decomposition layer is preferably more than or equal to 10 kPa from the viewpoint of promoting decomposition of the chemical decomposition layer, and preferably less than or equal to 10 GPa from the viewpoint of suppressing deterioration of the nitride semiconductor epitaxial layer.

In chemical decomposition layer 20, when a decomposition-promoted region is decomposed, a stress is concentrated on a region proximate to the decomposed region. A subsequent stress-concentrated region thus formed corresponds to a subsequent decomposition-promoted region. That is, with reference to FIGS. 7(B), 8(B) and 9, decomposition-promoted region 20r in chemical decomposition layer 20 moves from the outer peripheral part to the central part, so that decomposition of chemical decomposition layer 20 is promoted. In this manner, with reference to FIGS. 7(C) and 8(C), chemical decomposition layer 20 is efficiently decomposed. When chemical decomposition layer 20 is brought into contact with gas 210 or electrolytic solution 220 and a stress is applied thereto, chemical decomposition layer 20 can be rotated about a central axis perpendicular to its main surface to further improve decomposition of chemical decomposition layer 20. The number of revolutions is preferably more than or equal to 5 rpm and less than or equal to 100 rpm from the viewpoint of improving uniformity in decomposition and suppressing mechanical vibrations during rotation.

(Decomposition of Chemical Decomposition Layer by Jetting At Least Either Gas or Electrolytic Solution At Least to Part of Chemical Decomposition Layer)

Figure 10:
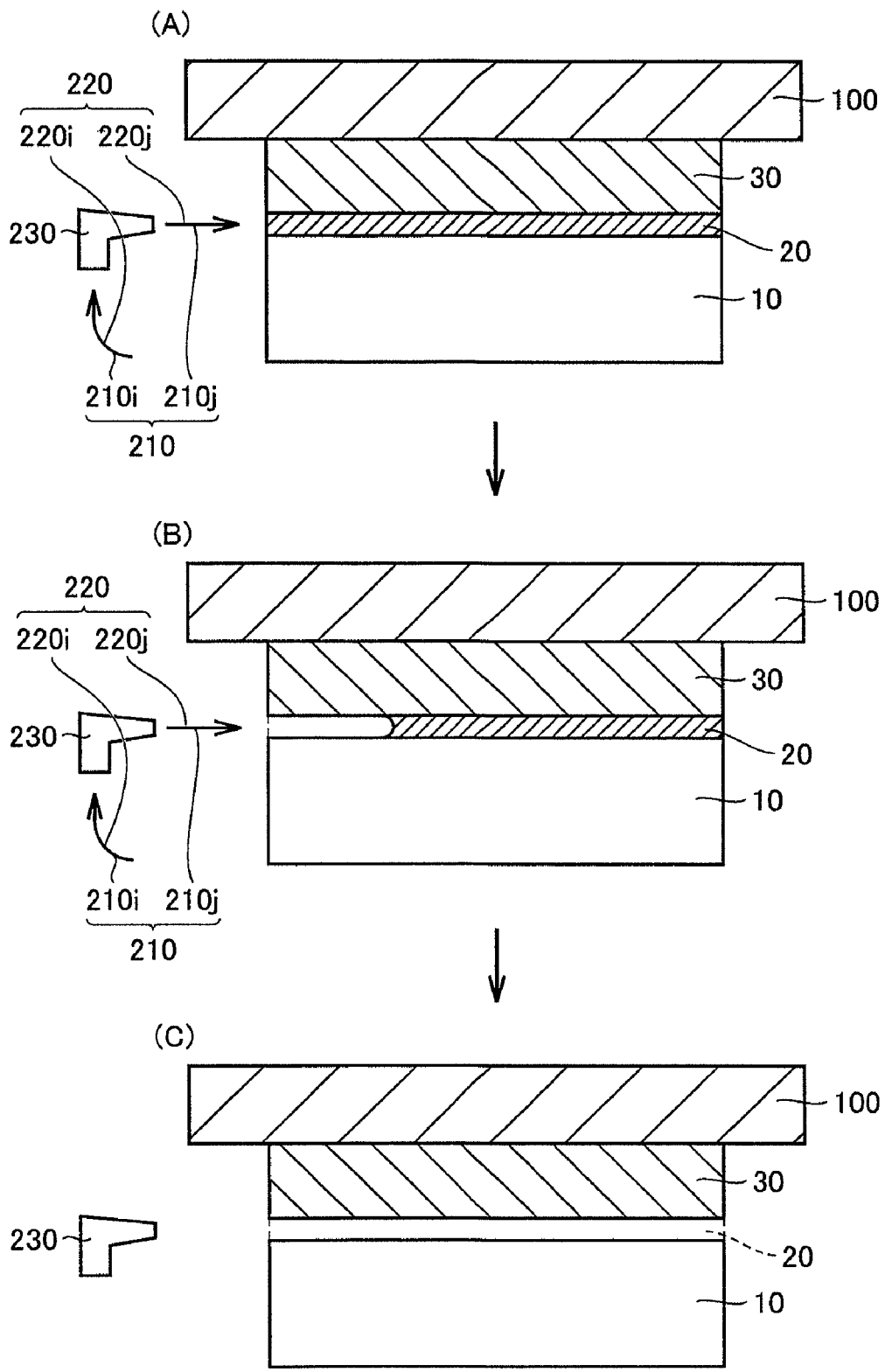
FIG. 10 is a schematic cross sectional view showing a method of decomposing the chemical decomposition layer by jetting the gas or the electrolytic solution to the chemical decomposition layer, illustrating (A) a state before the chemical decomposition layer is decomposed, (B) a state while the chemical decomposition layer is decomposed, and (C) a state after the chemical decomposition layer has been decomposed.
Figure 11:
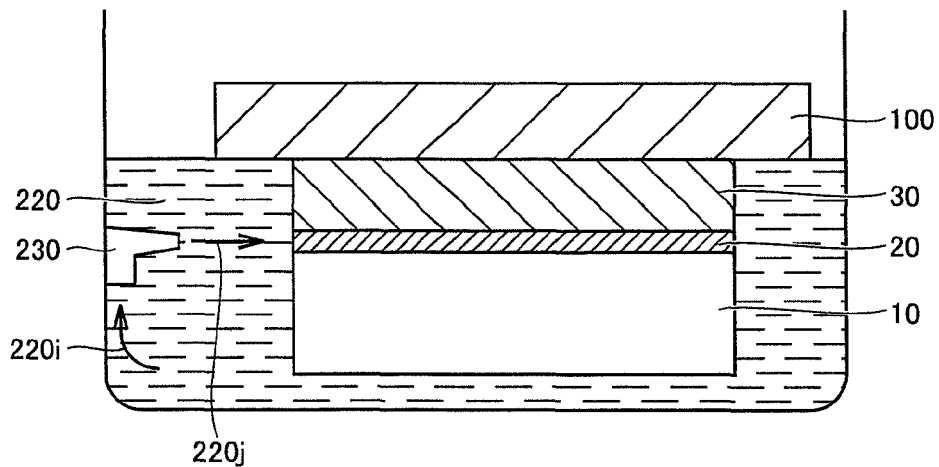
FIG. 11 is a schematic cross sectional view showing a method of decomposing the chemical decomposition layer by jetting the electrolytic solution to the chemical decomposition layer in the electrolytic solution, illustrating (A) a state before the chemical decomposition layer is decomposed, (B)
Figure 11:
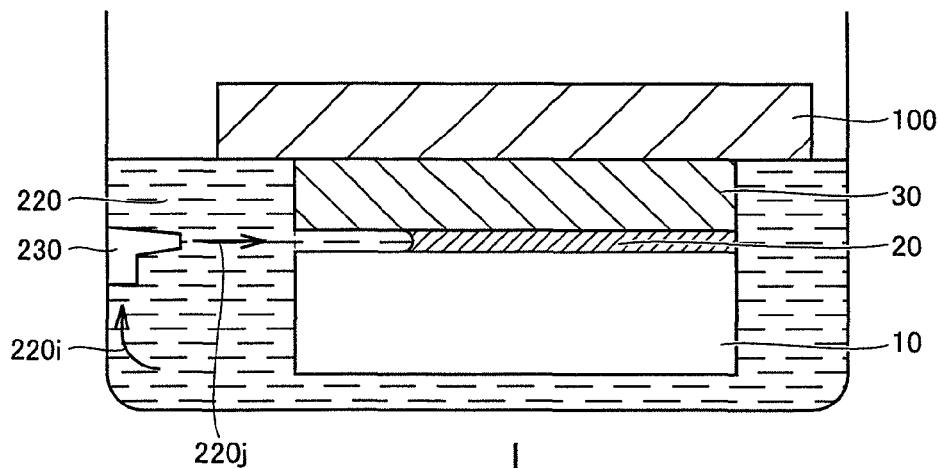
Figure 11:
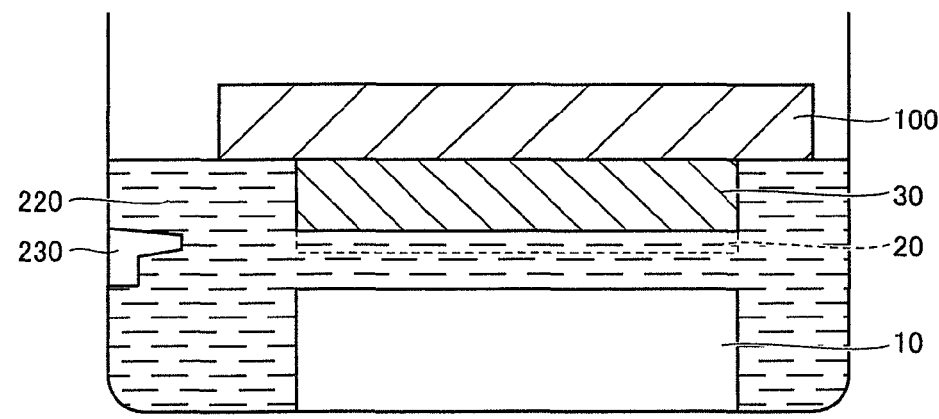

With reference to FIGS. 10 to 12, decomposition of chemical decomposition layer 20 at least with either gas 210 or electrolytic solution 220 can be performed by jetting at least either gas 210 or electrolytic solution 220 at least to part of chemical decomposition layer 20. At least part of chemical decomposition layer 20 is brought into contact with a jet 210j or 220j of gas 210 or electrolytic solution 220 to promote chemical decomposition of that part.

With reference to FIGS. 10(A), 11(A), and 12, the technique for bringing chemical decomposition layer 20 into contact with jet 210j or 220j of gas 210 or electrolytic solution 220 and the part to be brought into contact are not particularly limited, however, for example, nitride semiconductor epitaxial layer 30 grown on nitride semiconductor substrate 10 with chemical decomposition layer 20 interposed therebetween is temporarily supported on temporary supporting base material 100 with an adhesive or the like, following which the outer peripheral part of chemical decomposition layer 20 is brought into contact with jet 210j or 220j of gas 210 or electrolytic solution 220. Alternatively, after the above-mentioned nitride semiconductor epitaxial layer 30 is temporarily supported as described above, at least chemical decomposition layer 20 is placed in an atmosphere of gas 210 or electrolytic solution 220 to bring the outer peripheral part of chemical decomposition layer 20 into contact with jet 210j or 220j of gas 210 or electrolytic solution 220. Herein, for example, a jet creation device 230 can be used to feed an inflow 210i or 220i of gas 210 or electrolytic solution 220 to a fluid inlet of jet creation device 230 to be ejected through a fluid outlet of jet creation device 230. Although jet creation device 230 is not particularly limited, however, a jet pump, a vortex pump, an air-lift pump, or the like is used from the viewpoint of producing a partially high pressure.

With reference to FIG. 12, when the outer peripheral part of chemical decomposition layer 20 is brought into contact with jet 210j or 220j of gas 210 or electrolytic solution 220 as described above, jet 210j or 220j of gas 210 or electrolytic solution 220 weakens bonding among chemical species 20s constituting chemical decomposition layer 20 in a jet contact region. Chemical species 200s of gas 210 or electrolytic solution 220 are brought into contact and react with chemical species 20s whose bonding among the chemical species has been weakened, so that reaction product 290s is produced. Decomposition of chemical decomposition layer 20 is thereby promoted in the jet contact region. That is, the jet contact region in chemical decomposition layer 20 corresponds to decomposition-promoted region 20r, and chemical decomposition layer 20 is efficiently decomposed in decomposition-promoted region 20r.

Herein, although not particularly limited, a jet amount of jet 210j or 220j of gas 210 or electrolytic solution 220 is preferably more than or equal to 10 ml/sec from the viewpoint of promoting decomposition of chemical decomposition layer 20, and preferably less than or equal to 500 ml/sec from the viewpoint of preventing fracture of nitride semiconductor epitaxial layer 30. In chemical decomposition layer 20, when a decomposition-promoted region is decomposed, a jet is brought into contact with a region proximate to the decomposed region. A subsequent jet contact region thus formed corresponds to a subsequent decomposition-promoted region. That is, with reference to FIGS. 10(B), 11(B) and 12, moving decomposition-promoted region 20r in chemical decomposition layer 20 from the outer peripheral part to the central part or from an outer peripheral part through the central part to another outer peripheral part promotes decomposition of chemical decomposition layer 20. In this manner, with reference to FIGS. 10(C) and 11(C), chemical decomposition layer 20 is efficiently decomposed. When chemical decomposition layer 20 is brought into contact with jet 210j or 220j of gas 210 or electrolytic solution 220, chemical decomposition layer 20 can be rotated about a central axis perpendicular to its main surface to move the decomposition-promoted region in chemical decomposition layer 20 from the outer peripheral part to the central part, thereby further improving the efficiency in decomposition of the chemical decomposition layer (see FIG. 25(B)). The number of revolutions is preferably more than or equal to 5 rpm and less than or equal to 100 rpm from the viewpoint of improving uniformity in decomposition and suppressing mechanical vibrations during rotation.

(Decomposition of Chemical Decomposition Layer At Least with Either Gas or Electrolytic Solution and Further by Applying Light or Heat At Least to Part of Chemical Decomposition Layer)

With reference to FIGS. 13 to 15, decomposition of chemical decomposition layer 20 at least with either gas 210 or electrolytic solution 220 can be performed further by applying light or heat 240 at least to part of chemical decomposition layer 20. The application of light or heat 240 at least to part of chemical decomposition layer 20 promotes chemical decomposition of that part.

With reference to FIGS. 13(A), 14(A) and 15, the technique for applying light or heat 240 at least to part of chemical decomposition layer 20 and the part to which light or heat 240 is applied are not particularly limited, however, for example, nitride semiconductor epitaxial layer 30 grown on nitride semiconductor substrate 10 with chemical decomposition layer 20 interposed therebetween is temporarily supported on temporary supporting base material 100 with an adhesive or the like, following which at least chemical decomposition layer 20 can be placed in an atmosphere of gas 210 or electrolytic solution 220, and light or heat 240 is applied to the outer peripheral part of chemical decomposition layer 20.

With reference to FIG. 15, when light or heat 240 is applied to the outer peripheral part of chemical decomposition layer 20 as described above, energy of light or heat 240 weakens bonding among chemical species 20s constituting chemical decomposition layer 20 in a region to which light or heat has been applied. Chemical species 200s of gas 210 or electrolytic solution 220 are brought into contact and react with chemical species 20s whose bonding among chemical species 20s has been weakened, so that reaction product 290s is produced. Decomposition of chemical decomposition layer 20 is thereby promoted in the region to which light or heat 240 has been applied. That is, the region to which light or heat 240 has been applied in chemical decomposition layer 20 corresponds to decomposition-promoted region 20r, and chemical decomposition layer 20 is efficiently decomposed in decomposition-promoted region 20r.

Herein, although not particularly limited, light or heat 240 applied to chemical decomposition layer 20 is preferably laser light having an energy more than or equal to 0.62 eV and a peak wavelength less than or equal to 2 µm or heat having an energy more than or equal to 100 mJ/cm$^2$ obtained from such laser light from the viewpoint of promoting decomposition of chemical decomposition layer 20, or preferably laser light having an energy less than or equal to 3.1 eV and a peak wavelength more than or equal to 400 nm or heat having an energy less than or equal to 1000 mJ/cm$^2$ obtained from such laser light from the viewpoint of suppressing deterioration of the nitride semiconductor epitaxial layer. The temperature to which chemical decomposition layer 20 is heated by applied light or heat 240 is preferably more than or equal to 50° C. from the viewpoint of promoting decomposition of chemical decomposition layer 20, and preferably less than or equal to 600° C. from the viewpoint of suppressing deterioration of the nitride semiconductor epitaxial layer.

In chemical decomposition layer 20, when a decomposition-promoted region is decomposed, and light or heat 240 is subsequently applied to a region proximate to the decomposed region, then, the subsequent region to which light or heat has been applied corresponds to a subsequent decomposition-promoted region. That is, with reference to FIGS. 13(B), 14(B) and 15, moving decomposition-promoted region 20r in chemical decomposition layer 20 from the outer peripheral part to the central part or from an outer peripheral part through the central part to another outer peripheral part promotes decomposition of chemical decomposition layer 20. In this manner, with reference to FIGS. 13(C) and 14(C), chemical decomposition layer 20 is efficiently decomposed. Further, when light or heat is applied to chemical decomposition layer 20, chemical decomposition layer 20 can be rotated about a central axis perpendicular to its main surface to move the decomposition-promoted region formed by applying light or heat 240 to chemical decomposition layer 20 from the whole outer peripheral part to the central part, thereby further improving the efficiency in decomposition of chemical decomposition layer 20 (see FIG. 26(B)). The number of revolutions is preferably more than or equal to 5 rpm and less than or equal to 100 rpm from the viewpoint of improving uniformity in decomposition and suppressing mechanical vibrations during rotation.

Further, in separation of the chemical decomposition layer, from the viewpoint of promoting decomposition of the chemical decomposition layer, two or more methods of the method of using at least either the above-mentioned gas or the electrolytic solution and further applying a stress at least to part of the chemical decomposition layer, the method of jetting at least either a gas or an electrolytic solution at least to part of the chemical decomposition layer, and the method of using at least either a gas or an electrolytic solution and further applying light or heat at least to part of the chemical decomposition layer are suitably used in combination.

(Growth of Nitride Semiconductor Epitaxial Layer with Reproduced Nitride Semiconductor Substrate)

With reference to FIG. 1, the method of forming a nitride semiconductor epitaxial layer of the present embodiment can further include the steps of, after the step of separating nitride semiconductor epitaxial layer 30 from nitride semiconductor substrate 10 (FIG. 1(B)), surface treating a main surface of separated nitride semiconductor substrate 10 to reproduce nitride semiconductor substrate 10 (FIG. 1(D); T in the drawing indicates surface treatment), growing at least one layer of further nitride semiconductor epitaxial layer 30 on reproduced nitride semiconductor substrate 10 with another chemical decomposition layer 20 interposed therebetween (FIG. 1(A)), and decomposing the other chemical decomposition layer 20 at least with either a gas or an electrolytic solution at least either during or after the step of growing further nitride semiconductor epitaxial layer 30, thereby separating further nitride semiconductor epitaxial layer 30 from reproduced nitride semiconductor substrate 10 (FIG. 1(B)).

Through such steps, an expensive nitride semiconductor substrate is reproduced by surface treatment to repeatedly grow the nitride semiconductor epitaxial layer on the nitride semiconductor substrate and separate the nitride semiconductor epitaxial layer from the nitride semiconductor substrate, so that the nitride semiconductor epitaxial layer can be formed economically and efficiently.

Herein, the technique for surface treating the main surface of the separated nitride semiconductor substrate is not particularly limited only if a nitride semiconductor epitaxial layer can be grown on the separated nitride semiconductor substrate, and can be performed at least by one of grinding, polishing, and etching.

Second Embodiment

Embodiment of Method of Manufacturing Nitride Semiconductor Device

With reference to FIG. 1, the method of manufacturing a nitride semiconductor device of the present embodiment is a method of manufacturing a nitride semiconductor device including the nitride semiconductor epitaxial layer formed by the forming method of First Embodiment, and includes the steps of growing at least one layer of nitride semiconductor epitaxial layer 30 on nitride semiconductor substrate 10 with chemical decomposition layer 20 interposed therebetween (FIG. 1(A)), decomposing chemical decomposition layer 20 at least with either a gas or an electrolytic solution at least either during or after the step of growing nitride semiconductor epitaxial layer 30, thereby separating nitride semiconductor epitaxial layer 30 from nitride semiconductor substrate 10, and joining separated nitride semiconductor epitaxial layer 30 to a supporting substrate 40.

More specifically, the method of manufacturing a nitride semiconductor device of the present embodiment includes the steps of preparing nitride semiconductor epitaxial layer 30 formed by the forming method of First Embodiment (FIGS. 1(A) and (B)), and joining prepared nitride semiconductor epitaxial layer 30 to supporting substrate 40 (FIG. 1(C)). Nitride semiconductor epitaxial layer 30 formed by the method of manufacturing a nitride semiconductor device of the present embodiment is formed by a method similar to that of First Embodiment, and provides performance equivalent to that described in First Embodiment.

Since the method of manufacturing a nitride semiconductor device of the present embodiment includes the above-mentioned steps, a high-quality nitride semiconductor epitaxial layer can be obtained, so that a high-performance nitride semiconductor device can be obtained.

In the method of manufacturing a nitride semiconductor device of the present embodiment, supporting substrate 40 is preferably a conductive supporting substrate having an area specific resistance less than or equal to $0.05$ m$\Omega \cdot$cm$^2$ from the viewpoint of manufacturing a power device having a low on-resistance as a nitride semiconductor device.

With reference to FIGS. 21 and 22, the method of manufacturing a nitride semiconductor device of the present embodiment can further include the step of forming a recess 30$cp$ having a depth from a main surface of nitride semiconductor epitaxial layer 30 to reach chemical decomposition layer 20 (FIG. 21(C)) after the step of growing nitride semiconductor epitaxial layer 30 (FIG. 21(A)) and before the step of separating nitride semiconductor epitaxial layer 30 from nitride semiconductor substrate 10 (FIG. 22(B)). Since the method of manufacturing a nitride semiconductor device of the present embodiment includes the above-mentioned step, decomposition of chemical decomposition layer 20 is promoted, so that a nitride semiconductor device can efficiently be manufactured. Herein, the technique for forming recess 30$cp$ is not particularly limited, however, gas phase etching is preferable from the viewpoint of high accuracy in width and depth of a formed recess.

Example 1

1. Growth of Nitride Semiconductor Epitaxial Layer

With reference to FIG. 19(A), a GaN substrate having n-type conductivity and a dislocation density of $5 \times 10^6$ cm$^{-2}$ whose main surface has an off-angle of $0.6°$ with respect to a C plane was prepared as nitride semiconductor substrate 10.

Then, a 2-$\mu$m-thick GaN buffer layer having a carrier concentration of $1 \times 10^{18}$ cm$^{-3}$ was grown on the GaN substrate (nitride semiconductor substrate 10) as a buffer layer 11 by a MOCVD process. The growth conditions of GaN buffer layer 11 were such that the flow rate of an H$_2$ (hydrogen) gas containing a TMG (trimethylgallium) gas was 0.05 slm (herein, slm is a unit indicating a liter amount of gas in a normal state flowing per minute), (the flow rate of the TMG gas was 320 $\mu$mol/min), the flow rate of an NH$_3$ (ammonia) gas was 9 slm (0.4 mol/min), the flow rate of an H$_2$ (hydrogen) gas as a carrier gas was 11 slm, the ambient temperature (susceptor temperature) was 850° C. to 1200° C., and the ambient pressure (reactor internal pressure) was 200 to 500 Torr (26.7 to 66.7 kPa).

Then, a 1.5-$\mu$m-thick In$_x$Ga$_{1-x}$N chemical decomposition layer (x: 0 to 0.15) having an In composition gradient structure whose In composition increases from 0 mol % to 15 mol % from a first main surface to an inner portion and decreases from 15 mol % to 0 mol % from the inner portion to a second main surface was grown on GaN buffer layer 11 as chemical decomposition layer 20 by a MOCVD process. The growth conditions of the In$_x$Ga$_{1-x}$N chemical decomposition layer were such that the flow rate of an H$_2$ (hydrogen) gas containing a TMG (trimethylgallium) gas was 0.001 to 0.056 slm (the flow rate of the TMG gas was 5.7 to 320 $\mu$mol/min), the flow rate of an H$_2$ (hydrogen) gas containing a TMI (trimethylindium) gas was 0.05 to 0.5 slm (the flow rate of the TMI gas was 12.3 to 123 $\mu$mol/min), the flow rate of an NH$_3$ (ammonia) gas was 9 slm (0.4 mol/min), the flow rate of an H$_2$ (hydrogen) gas as a carrier gas was 5 slm, the flow rate of an N$_2$ (nitrogen) gas also as a carrier gas was 5 slm, the ambient temperature (susceptor temperature) was 500° C. to 900° C., and the ambient pressure (reactor internal pressure) was 50 to 500 Torr (6.7 to 66.7 kPa).

Then, a 1-$\mu$m-thick n$^+$-type GaN stop layer 30$p$ having a carrier concentration of $1 \times 10^{18}$ cm$^{-3}$ and a 5-$\mu$m-thick n$^-$-type GaN drift layer 30$q$ having a carrier concentration of $7 \times 10^{15}$ cm$^{-3}$ were sequentially grown on In$_x$Ga$_{1-x}$N chemical decomposition layer 20 as at least one layer of nitride semiconductor epitaxial layer 30 by a MOCVD process. The growth conditions of n$^+$-type GaN stop layer 30$p$ and n$^-$-type GaN drift layer 30$q$ were such that the flow rate of an H$_2$ (hydrogen) gas containing a TMG (trimethylgallium) gas was 0.056 slm (the flow rate of the TMG gas was 320 $\mu$mol/min), the flow rate of an NH$_3$ (ammonia) gas was 9 slm (0.4 mol/min), the flow rate of an H$_2$ (hydrogen) gas as a carrier gas was 11 slm, the ambient temperature (susceptor temperature) was 1050° C., and the ambient pressure (reactor internal pressure) was 200 to 500 Torr (26.7 to 66.7 kPa). During growth of the above-mentioned n$^+$-type GaN stop layer 30$p$ and n$^-$-type GaN drift layer 30$q$ (nitride semiconductor epitaxial layer 30), In$_x$Ga$_{1-x}$N chemical decomposition layer 20 is placed in an atmosphere of the NH$_3$ gas and the H$_2$ gas at 1050° C. for more than or equal to 2 hours, and is thus partially decomposed.

2. Separation of Nitride Semiconductor Epitaxial Layer

With reference to FIGS. 3 and 19(B), after n$^-$-type GaN drift layer 30$q$ of nitride semiconductor epitaxial layer 30 was temporarily supported on temporary supporting base material 100 with an adhesive or the like, the above-mentioned GaN substrate (nitride semiconductor substrate 10), In$_x$Ga$_{1-x}$N chemical decomposition layer 20, and nitride semiconductor epitaxial layer 30 were immersed in electrolytic solution 220 to bring In$_x$Ga$_{1-x}$N chemical decomposition layer 20 into contact with electrolytic solution 220, thereby decomposing In$_x$Ga$_{1-x}$N chemical decomposition layer 20, so that n$^+$-type GaN stop layer 30$p$ and n$^-$-type GaN drift layer 30$q$ (nitride semiconductor epitaxial layer 30) were separated from the GaN substrate (nitride semiconductor substrate 10). Herein, as electrolytic solution 220, an aqueous solution heated to 30° C. containing 12 mass % of potassium hydroxide and 5 mass % of ethylenediamine was used.

3. Production of Nitride Semiconductor Device

Then, a main surface of n$^+$-type GaN stop layer 30$p$ of nitride semiconductor epitaxial layer 30 was bonded and joined to a main surface of a Mo (molybdenum) substrate serving as supporting substrate 40. Then, temporary supporting base material 100 was detached, and an Au/Ni electrode was formed on a main surface of n$^-$-type GaN drift layer 30$q$ of nitride semiconductor epitaxial layer 30 as a Schottky electrode 50 by a sputtering process. A SBD (Schottky Barrier Diode) was thereby produced as a nitride semiconductor device. Thus obtained SBD had a withstand voltage (withstand electric voltage; hereinafter the same applies) of 600V and an on-resistance of $0.7$ m$\Omega \cdot$cm$^2$, which offered high performance. Herein, the withstand voltage and the on-resistance were measured with a high withstand voltage prober.

Example 2

A main surface of the GaN substrate (nitride semiconductor substrate) of n-type conductivity separated from the nitride semiconductor epitaxial layer composed of the $n^+$-type GaN stop layer and the $n^-$-type GaN drift layer in Example 1 was subjected to CMP, to reproduce the GaN substrate (nitride semiconductor substrate).

A GaN buffer layer was grown on the above-mentioned reproduced GaN substrate (nitride semiconductor substrate), similarly to Example 1.

Then, an $In_xGa_{1-x}N$ chemical decomposition layer (x: 0 to 0.2) having an In composition gradient structure whose In composition increased from 0 mol % to 20 mol % from a first main surface to an inner portion and decreased from 20 mol % to 0 mol % from the inner portion to a second main surface was grown on the above-mentioned GaN buffer layer as a chemical decomposition layer. The growth conditions of this $In_xGa_{1-x}N$ chemical decomposition layer were such that the flow rate of an $N_2$ (nitrogen) gas containing a TMG (trimethylgallium) gas was 0.001 to 0.056 slm (the flow rate of the TMG gas was 5.7 to 320 µmol/min), the flow rate of an $N_2$ (nitrogen) gas containing a TMI (trimethylindium) gas was 0.05 to 0.5 slm (the flow rate of the TMI gas was 12.3 to 123 µmol/min), the flow rate of an $NH_3$ (ammonia) gas was 9 slm (0.4 mol/min), the flow rate of an $N_2$ (nitrogen) gas as a carrier gas was 10 slm, the ambient temperature (susceptor temperature) was 500° C. to 900° C., and the ambient pressure (reactor internal pressure) was 50 to 500 Torr (6.7 to 66.7 kPa).

Then, a 1-µm-thick $n^+$-type GaN stop layer having a carrier concentration of $1\times10^{18}$ $cm^{-3}$ and a 5-µm-thick $n^-$-type GaN drift layer having a carrier concentration of $7\times10^{15}$ $cm^{-3}$ were sequentially grown on the above-mentioned $In_xGa_{1-x}N$ chemical decomposition layer as at least one layer of nitride semiconductor epitaxial layer, similarly to Example 1.

Then, similarly to Example 1, the nitride semiconductor epitaxial layer composed of the $n^+$-type GaN stop layer and the $n^-$-type GaN drift layer were separated from the GaN substrate (nitride semiconductor substrate 10), following which a Mo substrate (supporting substrate) was joined to a main surface of the $n^+$-type GaN stop layer of the nitride semiconductor epitaxial layer, and an Au/Ni electrode (Schottky electrode) was formed on a main surface of the $n^-$-type GaN drift layer of the nitride semiconductor epitaxial layer, so that a SBD was produced as a nitride semiconductor device.

Thus obtained SBD had a withstand voltage of 600V and an on-resistance of 0.7 mΩ·$cm^2$, which offered high performance.

Example 3

A GaN substrate (nitride semiconductor substrate) similar to that of Example 1 was prepared. A GaN buffer layer was grown on this GaN substrate (nitride semiconductor substrate), similarly to Example 1.

Then, an $In_xAl_{1-x}N$ chemical decomposition layer was grown on the above-mentioned GaN buffer layer as a chemical decomposition layer. The growth conditions of this $In_xAl_{1-x}N$ chemical decomposition layer were such that the flow rate of an $N_2$ (nitrogen) gas containing a TMA (trimethylaluminum) gas was 0.02 to 0.07 slm (the flow rate of the TMA gas was 15.6 to 54.5 µmol/min), the flow rate of an $N_2$ (nitrogen) gas containing a TMI (trimethylindium) gas was 0.1 to 0.5 slm (the flow rate of the TMI gas was 24.6 to 123 µmol/min), the flow rate of an $NH_3$ (ammonia) gas was 3 to 12 slm (0.13 to 0.54 mol/min), the flow rate of an $N_2$ (nitrogen) gas as a carrier gas was 11 slm, the ambient temperature (susceptor temperature) was 700° C. to 800° C., and the ambient pressure (reactor internal pressure) was 50 to 150 Torr (6.7 to 20.0 kPa).

Then, a 1-µm-thick $n^+$-type GaN stop layer having a carrier concentration of $1\times10^{18}$ $cm^{-3}$ and a 10-µm-thick $n^-$-type GaN drift layer having a carrier concentration of $7\times10^{15}$ $cm^{-3}$ were sequentially grown on the above-mentioned $In_xAl_{1-x}N$ chemical decomposition layer as at least one layer of nitride semiconductor epitaxial layer, similarly to Example 1.

Then, similarly to Example 1, the nitride semiconductor epitaxial layer composed of the $n^+$-type GaN stop layer and the $n^-$-type GaN drift layer were separated from the GaN substrate (nitride semiconductor substrate 10), following which a Mo substrate (supporting substrate) was joined to a main surface of the $n^+$-type GaN stop layer of the nitride semiconductor epitaxial layer, and an Au/Ni electrode (Schottky electrode) was formed on a main surface of the $n^-$-type GaN drift layer of the nitride semiconductor epitaxial layer, so that a SBD was produced as a nitride semiconductor device.

Thus obtained SBD had a withstand voltage of 1200V and an on-resistance of 1.1 mΩ·$cm^2$, which offered high performance.

The In composition of the $In_xAl_{1-x}N$ chemical decomposition layer of the present example was verified by X-ray diffraction to find that x=0.18. The lattice constant of such an $In_xAl_{1-x}N$ chemical decomposition layer (x=0.18) is substantially equal to that of GaN semiconductor. Therefore, in the present example, a thick nitride semiconductor epitaxial layer composed of the 1-µm-thick $n^+$-type GaN stop layer and the 10-µm-thick $n^-$-type GaN drift layer could be formed without causing cracks.

Since the ratio between the lattice constant in the a-axis direction and that in the c-axis direction varies depending on the type and ratio of chemical composition of layers, a high-quality GaN layer (nitride semiconductor epitaxial layer) could be grown on the $In_xAl_{1-x}N$ layer (chemical decomposition layer) with a diffraction angle 2θ relative to a (0002) plane of the $In_xAl_{1-x}N$ layer (chemical decomposition layer) having a value greater than the diffraction angle 2θ relative to the (0002) plane of the GaN layer (nitride semiconductor epitaxial layer) by 2000 to 3000 arcsec, and with the lattice constants of the $In_xAl_{1-x}N$ layer and the GaN layer matching in the a-axis direction, as a result of X-ray diffraction relative to the (0002) plane.

Example 4

A GaN substrate (nitride semiconductor substrate) similar to that of Example 1 was prepared. A GaN buffer layer was grown on this GaN substrate (nitride semiconductor substrate), similarly to Example 1.

Then, an $In_xAl_yGa_{1-x-y}N$ chemical decomposition layer was grown on the above-mentioned GaN buffer layer as a chemical decomposition layer. The growth conditions of this $In_xAl_yGa_{1-x-y}N$ chemical decomposition layer were such that the flow rate of an $N_2$ (nitrogen) gas containing a TMA (trimethylaluminum) gas was 0.02 to 0.07 slm (the flow rate of the TMA gas was 15.6 to 54.5 µmol/min), the flow rate of an $N_2$ (nitrogen) gas containing a TMG (trimethylgallium) gas was 0.1 to 0.5 slm (the flow rate of the TMG gas was 24.6 to 123 µmol/min), the flow rate of an $N_2$ (nitrogen) gas containing a TMI (trimethylindium) gas was 0.001 to 0.056 slm (the flow rate of the TMI gas was 5.7 to 320 μmol/min), the flow rate of an $NH_3$ (ammonia) gas was 3 to 12 slm (0.13 to 0.54 μmol/min), the flow rate of an $N_2$ (nitrogen) gas as a carrier gas was 11 slm, the ambient temperature (susceptor temperature) was 700° C. to 800° C., and the ambient pressure (reactor internal pressure) was 50 to 150 Torr (6.7 to 20.0 kPa).

Then, a 1-μm-thick $n^+$-type GaN stop layer having a carrier concentration of $1 \times 10^{18}$ cm$^{-3}$ and a 5-μm-thick $n^-$-type GaN drift layer having a carrier concentration of $7 \times 10^{15}$ cm$^{-3}$ were sequentially grown on the above-mentioned $In_xAl_yGa_{1-x-y}N$ chemical decomposition layer as at least one layer of nitride semiconductor epitaxial layer, similarly to Example 1.

Then, similarly to Example 1, the nitride semiconductor epitaxial layer composed of the $n^+$-type GaN stop layer and the $n^-$-type GaN drift layer were separated from the GaN substrate (nitride semiconductor substrate 10), following which a Mo substrate (supporting substrate) was joined to a main surface of the $n^+$-type GaN stop layer of the nitride semiconductor epitaxial layer, and an Au/Ni electrode (Schottky electrode) was formed on a main surface of the $n^-$-type GaN drift layer of the nitride semiconductor epitaxial layer, so that a SBD was produced as a nitride semiconductor device.

Thus obtained SBD had a withstand voltage of 600V and an on-resistance of 0.7 mΩ·cm$^2$, which offered high performance.

Example 5

With reference to FIGS. 18(A) and 19(A), the only exception to Example 1 is that, in the step of growing nitride semiconductor epitaxial layer 30 on the GaN substrate (nitride semiconductor substrate 10), a 0.2-μm-thick GaN layer having a hole concentration of $5 \times 10^{17}$ cm$^{-3}$, a 0.05-μm-thick $Al_xGa_{1-x}N$ layer (x=0.08) having a hole concentration of $1 \times 10^{16}$ cm$^{-3}$, and a 0.2-μm-thick GaN layer having a hole concentration of $1 \times 10^{16}$ cm$^{-3}$ were sequentially formed as a hole supply layer between GaN buffer layer 11 and $In_xGa_{1-x}N$ chemical decomposition layer 20. Herein, the hole concentrations were measured separately by a C-V measurement method. Thereafter, similarly to Example 1, nitride semiconductor epitaxial layer 30 was separated from the GaN substrate (nitride semiconductor substrate 10), and then a SBD was produced. Thus obtained SBD had a withstand voltage of 600V and an on-resistance of 0.8 mΩ·cm$^2$, which offered high performance.

In the present example, the time to separate the nitride semiconductor epitaxial layer from the GaN substrate (nitride semiconductor substrate) was reduced to about 70% as compared to Example 1.

Example 6

With reference to FIG. 4, a SBD was produced similarly to Example 1 with the exception that separation of nitride semiconductor epitaxial layer 30 composed of $n^+$-type GaN stop layer 30p and $n^-$-type GaN drift layer 30q from the GaN substrate (nitride semiconductor substrate 10) was performed by temporarily supporting nitride semiconductor epitaxial layer 30, formed on the GaN substrate (nitride semiconductor substrate 10) with $In_xGa_{1-x}N$ chemical decomposition layer 20 interposed therebetween, on transparent temporary supporting base material 110 with an adhesive or the like, then immersing the above-mentioned GaN substrate (nitride semiconductor substrate 10), $In_xGa_{1-x}N$ chemical decomposition layer 20, and nitride semiconductor epitaxial layer 30 in electrolytic solution 220, and irradiating $In_xGa_{1-x}N$ chemical decomposition layer 20 with light 222 having a wavelength of 320 to 400 nm while $In_xGa_{1-x}N$ chemical decomposition layer 20 and nitride semiconductor epitaxial layer 30 were in contact with electrolytic solution 220.

In the present example, the time to separate the nitride semiconductor epitaxial layer from the GaN substrate (nitride semiconductor substrate) was reduced to about 50% as compared to Example 1.

Example 7

With reference to FIG. 5, a SBD was produced similarly to Example 1 with the exception that separation of nitride semiconductor epitaxial layer 30 composed of $n^+$-type GaN stop layer 30p and $n^-$-type GaN drift layer 30q from the GaN substrate (nitride semiconductor substrate 10) was performed in the following manner. Specifically, with respect to nitride semiconductor epitaxial layer 30 formed on the GaN substrate (nitride semiconductor substrate 10) with $In_xGa_{1-x}N$ chemical decomposition layer 20 interposed therebetween, nitride semiconductor substrate 10 was temporarily supported on conductive temporary supporting base material 122 with a conductive bond or the like, and nitride semiconductor epitaxial layer 30 was temporarily supported on conductive temporary supporting base material 124 with a conductive bond or the like. A platinum (Pt) electrode was placed in electrolytic solution 220 as cathode 224c. Then, a voltage was applied across anode 226a and cathode 226c with temporary supporting base material 122 serving as anode 226a and temporary supporting base material 124 serving as cathode 226c while the above-mentioned GaN substrate (nitride semiconductor substrate 10), $In_xGa_{1-x}N$ chemical decomposition layer 20, and nitride semiconductor epitaxial layer 30 were immersed in and thus brought into contact with electrolytic solution 220, thereby decomposing $In_xGa_{1-x}N$ chemical decomposition layer 20, so that nitride semiconductor epitaxial layer 30 was separated from the GaN substrate (nitride semiconductor substrate 10).

Thus obtained SBD had a withstand voltage of 800V and an on-resistance of 0.7 mΩ·cm$^2$, which offered high performance.

In the present example, the time to separate the nitride semiconductor epitaxial layer from the GaN substrate (nitride semiconductor substrate) was reduced to about 80% as compared to Example 1.

Example 8

With reference to FIG. 6, a SBD was produced similarly to Example 1 with the exception that separation of nitride semiconductor epitaxial layer 30 composed of $n^+$-type GaN stop layer 30p and $n^-$-type GaN drift layer 30q from the GaN substrate (nitride semiconductor substrate 10) was performed in the following manner. Specifically, with respect to nitride semiconductor epitaxial layer 30 formed on the GaN substrate (nitride semiconductor substrate 10) with $In_xGa_{1-x}N$ chemical decomposition layer 20 interposed therebetween, nitride semiconductor substrate 10 was temporarily supported on conductive temporary supporting base material 122 with a conductive bond or the like, and nitride semiconductor epitaxial layer 30 was temporarily supported on conductive temporary supporting base material 124 with a conductive bond or the like. Then, a voltage was applied across anode 226a and cathode 226c with temporary supporting base material 122 serving as anode 226a and temporary supporting base material 124 serving as cathode 226c while the above-mentioned GaN substrate (nitride semiconductor substrate 10), In$_x$Ga$_{1-x}$N chemical decomposition layer 20, and nitride semiconductor epitaxial layer 30 were immersed in and thus brought into contact with electrolytic solution 220, thereby decomposing In$_x$Ga$_{1-x}$N chemical decomposition layer 20, so that nitride semiconductor epitaxial layer 30 was separated from the GaN substrate (nitride semiconductor substrate 10).

Thus obtained SBD had a withstand voltage of 800V and an on-resistance of 0.7 mΩ·cm$^2$, which offered high performance.

In the present example, the time to separate the nitride semiconductor epitaxial layer from the GaN substrate (nitride semiconductor substrate) was merely reduced to about 90% as compared to Example 1, however, decomposition of the nitride semiconductor epitaxial layer with the electrolytic solution was suppressed as compared to Example 1, resulting in a better surface state of the separated nitride semiconductor epitaxial layer than in Example 1.

Example 9

1. Growth of Nitride Semiconductor Epitaxial Layer

With reference to FIG. 20(A), a GaN substrate similar to that of Example 1 was prepared as nitride semiconductor substrate 10. Then, similarly to Example 1, GaN buffer layer 11 was grown on the GaN substrate (nitride semiconductor substrate 10), and In$_x$Ga$_{1-x}$N chemical decomposition layer 20 (x: 0 to 0.15) was grown on GaN buffer layer 11.

Then, 1-μm-thick n$^+$-type GaN stop layer 30p having a carrier concentration of 1×10$^{18}$ cm$^{-3}$, 5-μm-thick n$^-$-type GaN drift layer 30q having a carrier concentration of 7×10$^{15}$ cm$^{-3}$, and a 0.5-μm-thick p-type GaN guard ring layer 30r having a carrier concentration of 1×10$^{18}$ cm$^{-3}$ were sequentially grown on In$_x$Ga$_{1-x}$N chemical decomposition layer 20 as at least one layer of nitride semiconductor epitaxial layer 30 by a MOCVD process. The growth conditions of these nitride semiconductor epitaxial layer 30 were such that the flow rate of an H$_2$ (hydrogen) gas containing a TMG (trimethylgallium) gas was 0.05 slm (the flow rate of the TMG gas was 320 μmol/min), the flow rate of an NH$_3$ (ammonia) gas was 9 slm (0.4 mol/min), the flow rate of an H$_2$ (hydrogen) gas as a carrier gas was 11 slm, the ambient temperature (susceptor temperature) was 1050° C., and the ambient pressure (reactor internal pressure) was 200 to 500 Torr (26.7 to 66.7 kPa). During growth of the above-mentioned nitride semiconductor epitaxial layer 30, In$_x$Ga$_{1-x}$N chemical decomposition layer 20 is placed in an atmosphere of the NH$_3$ gas and the H$_2$ gas at 1050° C. for more than or equal to 2 hours, and is thus partially decomposed.

2. Separation of Nitride Semiconductor Epitaxial Layer

With reference to FIG. 20(B), nitride semiconductor epitaxial layer 30 was separated from the GaN substrate (nitride semiconductor substrate 10), similarly to Example 8.

3. Production of Nitride Semiconductor Device

Then, with reference to FIG. 20(C), a Mo (molybdenum) substrate serving as supporting substrate 40 was formed on a main surface of n$^+$-type GaN stop layer 30p of nitride semiconductor epitaxial layer 30 by a sputtering process. Then, temporary supporting base material 100 was detached, following which part of p-type GaN guard ring layer 30r of nitride semiconductor epitaxial layer 30 was removed by ICP (inductively coupled plasma) etching, and an Au/Ni electrode was formed as Schottky electrode 50 at the removed part by a sputtering process. A SBD (Schottky Barrier Diode) was thereby produced as a nitride semiconductor device. Thus obtained SBD had a withstand voltage of 800V and an on-resistance of 0.7 mΩ·cm$^2$, which offered high performance.

Example 10

1. Growth of Nitride Semiconductor Epitaxial Layer

With reference to FIG. 21(A), a GaN substrate similar to that of Example 1 was prepared as nitride semiconductor substrate 10 with the exception that a main surface had an off-angle of 0.4° relative to a C plane. Then, similarly to Example 3, GaN buffer layer 11 was grown on the GaN substrate (nitride semiconductor substrate 10), and In$_x$Al$_{1-x}$N chemical decomposition layer 20 (x=0.18) was grown on GaN buffer layer 11.

Then, similarly to Example 9, 1-μm-thick n$^+$-type GaN stop layer 30p having a carrier concentration of 1×10$^{18}$ cm$^{-3}$, 5-μm-thick n$^-$-type GaN drift layer 30q having a carrier concentration of 7×10$^{15}$ cm$^{-3}$, and 0.5-μm-thick p-type GaN guard ring layer 30r having a carrier concentration of 1×10$^{18}$ cm$^{-3}$ were sequentially grown on In$_x$Al$_{1-x}$N chemical decomposition layer 20 as at least one layer of nitride semiconductor epitaxial layer 30 by a MOCVD process. During growth of the above-mentioned nitride semiconductor epitaxial layer 30, In$_x$Al$_{1-x}$N chemical decomposition layer 20 is placed in an atmosphere of the NH$_3$ gas and the H$_2$ gas at 1050° C. for more than or equal to 2 hours, and is thus partially decomposed.

2. Step of Forming Recess in Nitride Semiconductor Epitaxial Layer

With reference to FIG. 21(B), part of p-type GaN guard ring layer 30r of nitride semiconductor epitaxial layer 30 was removed by ICP (inductively coupled plasma) etching, and an Au/Ni electrode nitride was formed as Schottky electrode 50 at the removed part by a sputtering process.

Then, a mask 300 protecting p-type GaN guard ring layer 30r with Schottky electrode 50 formed therein was formed. Mask 300 was made of SiO$_2$, and openings 300w having a width of 30 μm were formed at intervals of 1.2 mm in a grid pattern as viewed from a main surface of mask 300.

Then, with reference to FIG. 21(C), groove-like recesses 30cp extending from a main surface of p-type GaN guard ring layer 30r of nitride semiconductor epitaxial layer 30 through n$^-$-type GaN drift layer 30q and n$^+$-type GaN stop layer 30p to reach In$_x$Al$_{1-x}$N chemical decomposition layer 20 were formed in openings 300w of mask 300 by ICP etching. Herein, ICP etching was conducted until the bottom of the recesses reaches the inside of In$_x$Al$_{1-x}$N chemical decomposition layer 20 with light emission by In and/or Al serving as an indicator. Then, with reference to FIG. 22(A), mask 300 was removed with a hydrofluoric acid (HF) aqueous solution.

3. Separation of Nitride Semiconductor Epitaxial Layer

With reference to FIG. 22(B), p-type GaN guard ring layer 30r, with Schottky electrode 50 formed therein, of nitride semiconductor epitaxial layer 30 with recesses 30cp formed therein was temporarily supported on temporary supporting base material 100 with a wax 150, and then the above-mentioned GaN substrate (nitride semiconductor substrate 10), In$_x$Al$_{1-x}$N chemical decomposition layer 20, and nitride semiconductor epitaxial layer 30 were immersed in electrolytic solution 220 to bring In$_x$Al$_{1-x}$N chemical decomposition layer 20 into contact with electrolytic solution 220, so that nitride semiconductor epitaxial layer 30 was separated from the GaN substrate (nitride semiconductor substrate 10). Herein, as the method of separation, a method similar to that of Example 8 was used.

4. Production of Nitride Semiconductor Device

With reference to FIG. 22(C), a Mo (molybdenum) electrode was formed as an ohmic electrode 400 on $n^+$-type GaN stop layer 30p of nitride semiconductor epitaxial layer 30 by a sputtering process. Then, such ohmic electrode 400 was joined to supporting substrate 40 with a metal bonding 440. A SBD (Schottky Barrier Diode) was thereby produced as a nitride semiconductor device. Thus obtained SBD had a withstand voltage of 900V and an on-resistance of 0.7 mΩ·cm$^2$, which offered high performance.

In the present example, forming the recesses having a depth from the main surface of the nitride semiconductor epitaxial layer to reach the chemical decomposition layer after the step of growing the nitride semiconductor epitaxial layer and before the step of separating the nitride semiconductor epitaxial layer from the nitride semiconductor substrate promoted separation of the nitride semiconductor epitaxial layer from the nitride semiconductor substrate, so that a high-performance SBD was obtained efficiently.

Example 11

1. Growth of Nitride Semiconductor Epitaxial Layer

With reference to FIG. 23(A), a GaN substrate (nitride semiconductor substrate 10) similar to that of Example 1 was prepared.

Then, a 2-μm-thick GaN buffer layer having a carrier concentration of $1\times10^{18}$ cm$^{-3}$ was grown on the GaN substrate (nitride semiconductor substrate 10) as buffer layer 11 by a MOCVD process. The growth conditions of the GaN buffer layer were such that the flow rate of an N$_2$ (nitrogen) gas containing a TMG (trimethylgallium) gas was 0.05 slm (the flow rate of the TMG gas was 320 μmol/min), the flow rate of an NH$_3$ (ammonia) gas was 12 slm (0.54 mol/min), the flow rate of an N$_2$ (nitrogen) gas as a carrier gas was 8 slm, the ambient temperature (susceptor temperature) was 1050° C., and the ambient pressure (reactor internal pressure) was 100 Torr (13.3 kPa).

Then, an In$_x$Al$_{1-x}$N chemical decomposition layer was grown on GaN buffer layer 11 as chemical decomposition layer 20 by a MOCVD process. The growth conditions of this In$_x$Al$_{1-x}$N layer were such that the flow rate of an N$_2$ (nitrogen) gas containing a TMA (trimethylaluminum) gas was 0.4 slm (the flow rate of the TMA gas was 31.2 μmol/min), the flow rate of an N$_2$ (nitrogen) gas containing a TMI (trimethylindium) gas was 0.4 slm (the flow rate of the TMI gas was 100 μmol/min), the flow rate of an NH$_3$ (ammonia) gas was 12 slm (0.54 mol/min), the flow rate of an N$_2$ (nitrogen) gas as a carrier gas was 8 slm, the ambient temperature (susceptor temperature) was 810° C., and the ambient pressure (reactor internal pressure) was 100 Torr (13.3 kPa).

Then, 1-μm-thick $n^+$-type GaN stop layer 30p having a carrier concentration of $1\times10^{18}$ cm$^{-3}$ and 5-μm-thick $n^-$-type GaN drift layer 30q having a carrier concentration of $9\times10^{15}$ cm$^{-3}$ were sequentially grown on In$_x$Al$_{1-x}$N chemical decomposition layer 20 as at least one layer of nitride semiconductor epitaxial layer 30 by a MOCVD process. The growth conditions of $n^+$-type GaN stop layer 30p were such that the flow rate of an N$_2$ (nitrogen) gas containing a TMG (trimethylgallium) gas was 0.056 slm (320 μmol/min), the flow rate of an NH$_3$ (ammonia) gas was 12 slm (0.54 mol/min), the flow rate of an H$_2$ (hydrogen) gas containing 2 ppm of a SiH$_4$ (monosilane) gas was 0.2 slm (the flow rate of the SiH$_4$ gas was 17 nmol/min), the flow rate of an N$_2$ (nitrogen) gas as a carrier gas was 8 slm, the ambient temperature (susceptor temperature) was 1050° C., and the ambient pressure (reactor internal pressure) was 100 Torr (13.3 kPa). The growth conditions of $n^-$-type GaN drift layer 30q were similar to those of $n^+$-type GaN stop layer 30p with the exception that the flow rate of an H$_2$ (hydrogen) gas containing 2 ppm of a SiH$_4$ (monosilane) gas was 0.02 slm (the flow rate of the SiH$_4$ gas was 1.7 nmol/min). During growth of the above-mentioned $n^+$-type GaN stop layer 30p and $n^-$-type GaN drift layer 30q (nitride semiconductor epitaxial layer 30), In$_x$Al$_{1-x}$N chemical decomposition layer 20 is placed in an atmosphere of the NH$_3$ gas and the H$_2$ gas at 1050° C. for more than or equal to 3 hours, and is thus partially decomposed.

Then, an Au/Ni electrode 50a and an Si$_x$N$_y$ field plate 50b were formed as Schottky electrode 50 on $n^-$-type GaN drift layer 30q of nitride semiconductor epitaxial layer 30 by a sputtering process.

2. Separation of Nitride Semiconductor Epitaxial Layer

Then, with reference to FIG. 23(B), after Si$_x$N$_y$ field plate 50b of Schottky electrode 50 formed on nitride semiconductor epitaxial layer 30 was temporarily supported on temporary supporting base material 100 with an adhesive or the like, the above-mentioned GaN substrate (nitride semiconductor substrate 10), In$_x$Al$_{1-x}$N chemical decomposition layer 20, and nitride semiconductor epitaxial layer 30 were immersed in electrolytic solution 220 to bring In$_x$Al$_{1-x}$N chemical decomposition layer 20 into contact with electrolytic solution 220, thereby decomposing In$_x$Al$_{1-x}$N chemical decomposition layer 20, so that $n^+$-type GaN stop layer 30p and $n^-$-type GaN drift layer 30q (nitride semiconductor epitaxial layer 30) were separated from the GaN substrate (nitride semiconductor substrate 10). Herein, as electrolytic solution 220, an aqueous solution heated to 30° C. containing 12 mass % of potassium hydroxide and 5 mass % of ethylenediamine was used.

3. Production of Nitride Semiconductor Device

Then, with reference to FIG. 23(C), a Mo electrode was formed as ohmic electrode 400 on $n^+$-type GaN stop layer 30p of nitride semiconductor epitaxial layer 30 by a sputtering process. Then, after a Mo substrate was bonded to this Mo electrode (ohmic electrode 400) as supporting substrate 40 with AuSn, the temporary supporting base material was removed. A SBD (Schottky Barrier Diode) was thereby produced as a nitride semiconductor device. Thus obtained SBD had a withstand voltage of 800V and an on-resistance of 0.7 mΩ·cm$^2$, which offered high performance. Herein, the withstand voltage and the on-resistance were measured with a high withstand voltage prober.

Example 12

1. Growth of Nitride Semiconductor Epitaxial Layer

With reference to FIG. 24(A), a GaN substrate (nitride semiconductor substrate 10) similar to that of Example 1 was prepared. Then, nitride semiconductor epitaxial layer 30 ($n^+$-type GaN stop layer 30p and if-type GaN drift layer 30q) and Schottky electrode 50 (Au/Ni electrode 50a and Si$_x$N$_y$ field plate 50b) were sequentially formed on this GaN substrate (nitride semiconductor substrate 10), similarly to Example 11.

2. Separation of Nitride Semiconductor Epitaxial Layer

Then, with reference to FIG. 24(B), In$_x$Ga$_{1-x}$N chemical decomposition layer 20 was decomposed similarly to Example 11 so that $n^+$-type GaN stop layer 30p and $n^-$-type GaN drift layer 30q (nitride semiconductor epitaxial layer 30) were separated from the GaN substrate (nitride semiconductor substrate 10) with the exception that, after Si$_x$N$_y$ field plate 50b of Schottky electrode 50 formed on nitride semiconductor epitaxial layer 30 was temporarily supported on temporary supporting base material 100 with an adhesive or the like, a pressure of 50 kPa was applied to the central part as a compression stress with the outer peripheral part of temporary supporting base material 100 fixed, and the above-mentioned GaN substrate (nitride semiconductor substrate 10), $In_xGa_{1-x}N$ chemical decomposition layer 20, and nitride semiconductor epitaxial layer 30 were immersed in electrolytic solution 220 to bring $In_xGa_{1-x}N$ chemical decomposition layer 20 into contact with electrolytic solution 220. In the present example, the time to separate nitride semiconductor epitaxial layer 30 from the GaN substrate (nitride semiconductor substrate 10) was reduced to about 50% as compared to Example 11.

3. Production of Nitride Semiconductor Device

Then, with reference to FIG. 24(C), a SBD (Schottky Barrier Diode) was produced as a nitride semiconductor device similarly to Example 11. Thus obtained SBD had a withstand voltage (withstand electric voltage; hereinafter the same applies) of 800V and an on-resistance of 0.7 m$\Omega\cdot$cm$^2$, which offered high performance.

Example 13

1. Growth of Nitride Semiconductor Epitaxial Layer

With reference to FIG. 25(A), a GaN substrate (nitride semiconductor substrate 10) similar to that of Example 1 was prepared. Then, nitride semiconductor epitaxial layer 30 (n$^+$-type GaN stop layer 30$p$ and n$^-$-type GaN drift layer 30$q$) and Schottky electrode 50 (Au/Ni electrode 50$a$ and $Si_xN_y$ field plate 50$b$) were sequentially formed on this GaN substrate (nitride semiconductor substrate 10), similarly to Example 11.

2. Separation of Nitride Semiconductor Epitaxial Layer

Then, with reference to FIG. 25(B), after $Si_xN_y$ field plate 50$b$ of Schottky electrode 50 formed on nitride semiconductor epitaxial layer 30 was temporarily supported on temporary supporting base material 100 with an adhesive or the like, the above-mentioned GaN substrate (nitride semiconductor substrate 10), $In_xGa_{1-x}N$ chemical decomposition layer 20, and nitride semiconductor epitaxial layer 30 were immersed in electrolytic solution 220, and a jet 220$j$ of electrolytic solution 220 of a jet amount of about 100 ml/sec was brought into contact sequentially from the outer peripheral part to the central part of $In_xGa_{1-x}N$ chemical decomposition layer 20 by a compact water jet device (manufactured by DISCO Corporation, DAW4110) which is a jet creation device 230 located in electrolytic solution 220 while the GaN substrate (nitride semiconductor substrate 10), $In_xGa_{1-x}N$ chemical decomposition layer 20, and nitride semiconductor epitaxial layer 30 were rotated about a central axis perpendicular to their main surfaces at 10 rpm, thereby decomposing $In_xGa_{1-x}N$ chemical decomposition layer 20, so that n$^+$-type GaN stop layer 30$p$ and n$^-$-type GaN drift layer 30$q$ (nitride semiconductor epitaxial layer 30) were separated from the GaN substrate (nitride semiconductor substrate 10). In the present example, the time to separate nitride semiconductor epitaxial layer 30 from the GaN substrate (nitride semiconductor substrate 10) was reduced to about 30% as compared to Example 11.

3. Production of Nitride Semiconductor Device

Then, with reference to FIG. 25(C), a SBD (Schottky Barrier Diode) was produced as a nitride semiconductor device similarly to Example 11. Thus obtained SBD had a withstand voltage (withstand electric voltage; hereinafter the same applies) of 800V and an on-resistance of 0.7 m$\Omega\cdot$cm$^2$, which offered high performance.

Example 14

1. Growth of Nitride Semiconductor Epitaxial Layer

With reference to FIG. 26(A), a GaN substrate (nitride semiconductor substrate 10) similar to that of Example 1 was prepared. Then, nitride semiconductor epitaxial layer 30 (n$^+$-type GaN stop layer 30$p$ and n$^-$-type GaN drift layer 30$q$) and Schottky electrode 50 (Au/Ni electrode 50$a$ and $Si_xN_y$ field plate 50$b$) were sequentially formed on this GaN substrate (nitride semiconductor substrate 10), similarly to Example 11.

2. Separation of Nitride Semiconductor Epitaxial Layer

Then, with reference to FIG. 26(B), after $Si_xN_y$ field plate 50$b$ of Schottky electrode 50 formed on nitride semiconductor epitaxial layer 30 was temporarily supported on temporary supporting base material 100 with an adhesive or the like, the above-mentioned GaN substrate (nitride semiconductor substrate 10), $In_xGa_{1-x}N$ chemical decomposition layer 20, and nitride semiconductor epitaxial layer 30 were immersed in electrolytic solution 220, and laser light having a peak wavelength of 1060 nm and an energy of 100 mJ/cm$^2$ was applied sequentially from the outer peripheral part to the central part of chemical decomposition layer 20 for heating those parts by a YAG laser (manufactured by Japan Laser Corporation, brilliant b 532 nm) while the GaN substrate (nitride semiconductor substrate 10), $In_xGa_{1-x}N$ chemical decomposition layer 20, and nitride semiconductor epitaxial layer 30 were rotated about a central axis perpendicular to their main surfaces at 10 rpm, thereby decomposing $In_xGa_{1-x}N$ chemical decomposition layer 20, so that n$^+$-type GaN stop layer 30$p$ and n$^-$-type GaN drift layer 30$q$ (nitride semiconductor epitaxial layer 30) were separated from the GaN substrate (nitride semiconductor substrate 10). In the present example, the time to separate nitride semiconductor epitaxial layer 30 from the GaN substrate (nitride semiconductor substrate 10) was reduced to about 30% as compared to Example 11.

3. Production of Nitride Semiconductor Device

Then, with reference to FIG. 26(C), a SBD (Schottky Barrier Diode) was produced as a nitride semiconductor device similarly to Example 11. Thus obtained SBD had a withstand voltage (withstand electric voltage; hereinafter the same applies) of 900V and an on-resistance of 0.7 m$\Omega\cdot$cm$^2$, which offered high performance.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of forming a nitride semiconductor epitaxial layer, comprising the steps of:

growing at least one layer of nitride semiconductor epitaxial layer on a nitride semiconductor substrate having a dislocation density lower than or equal to 1×10$^7$ cm$^{-2}$ with a chemical decomposition layer interposed therebetween, said chemical decomposition layer being chemically decomposed with at least one selected from the group consisting of a gas and an electrolytic solution; and decomposing said chemical decomposition layer at least with one of said gas and said electrolytic solution at least one of during and after the step of growing said nitride semiconductor epitaxial layer, thereby separating said nitride semiconductor epitaxial layer from said nitride semiconductor substrate, wherein said chemical decomposition layer is a nitride semiconductor layer containing indium.

2. The method of forming a nitride semiconductor epitaxial layer in accordance with claim 1, wherein decomposition of said chemical decomposition layer after the step of growing said nitride semiconductor epitaxial layer is performed by bringing at least said chemical decomposition layer into contact with said electrolytic solution.

3. The method of forming a nitride semiconductor epitaxial layer in accordance with claim 2, wherein said electrolytic solution is in contact with said chemical decomposition layer and said nitride semiconductor epitaxial layer, and contains at least one of a chemical substance promoting decomposition of said chemical decomposition layer and a chemical substance suppressing decomposition of said nitride semiconductor epitaxial layer.

4. The method of forming a nitride semiconductor epitaxial layer in accordance with claim 2, wherein said chemical decomposition layer is irradiated with light while at least said chemical decomposition layer is in contact with said electrolytic solution.

5. The method of forming a nitride semiconductor epitaxial layer in accordance with claim 2, wherein
a cathode is located in said electrolytic solution, and
a voltage is applied across said chemical decomposition layer and said cathode such that said chemical decomposition layer serves as an anode, while at least said chemical decomposition layer is in contact with said electrolytic solution.

6. The method of forming a nitride semiconductor epitaxial layer in accordance with claim 2, wherein a voltage is applied across said nitride semiconductor substrate and said nitride semiconductor epitaxial layer such that said nitride semiconductor substrate serves as an anode and said nitride semiconductor epitaxial layer serves as a cathode, while said nitride semiconductor substrate, said chemical decomposition layer, and said nitride semiconductor epitaxial layer are in contact with said electrolytic solution.

7. The method of forming a nitride semiconductor epitaxial layer in accordance with claim 1, wherein decomposition of said chemical decomposition layer during the step of growing said nitride semiconductor epitaxial layer is performed by bringing at least said chemical decomposition layer into contact with said gas containing at least one of a hydrogen gas and an ammonia gas, and decomposition of said chemical decomposition layer after the step of growing said nitride semiconductor epitaxial layer is performed by bringing at least said chemical decomposition layer into contact with said electrolytic solution.

8. The method of forming a nitride semiconductor epitaxial layer in accordance with claim 7, wherein in the step of growing said nitride semiconductor epitaxial layer, said chemical decomposition layer is grown at an ambient temperature less than or equal to 900° C., and said chemical decomposition layer is decomposed at an ambient temperature more than or equal to 1000° C.

9. The method of forming a nitride semiconductor epitaxial layer in accordance with claim 1, wherein in the step of growing said nitride semiconductor epitaxial layer, a hole supply layer supplying a hole to said chemical decomposition layer is formed in proximity to said chemical decomposition layer and between said nitride semiconductor substrate and said nitride semiconductor epitaxial layer.

10. The method of forming a nitride semiconductor epitaxial layer in accordance with claim 1, wherein decomposition of said chemical decomposition layer at least one of during and after the step of growing said nitride semiconductor epitaxial layer is performed by bringing said chemical decomposition layer into contact with said gas containing at least one of a hydrogen gas and an ammonia gas.

11. The method of forming a nitride semiconductor epitaxial layer in accordance with claim 10, wherein in the step of growing said nitride semiconductor epitaxial layer, said chemical decomposition layer is grown at an ambient temperature less than or equal to 900° C., and said chemical decomposition layer is decomposed at an ambient temperature more than or equal to 1000° C.

12. The method of forming a nitride semiconductor epitaxial layer in accordance with claim 1, wherein decomposition of said chemical decomposition layer at least with one of said gas and said electrolytic solution is performed further by applying a stress at least to part of said chemical decomposition layer.

13. The method of forming a nitride semiconductor epitaxial layer in accordance with claim 12, wherein at least one of said gas and said electrolytic solution contains a chemical substance suppressing decomposition of said nitride semiconductor epitaxial layer.

14. The method of forming a nitride semiconductor epitaxial layer in accordance with claim 1, wherein decomposition of said chemical decomposition layer at least with one of said gas and said electrolytic solution is performed by jetting at least one of said gas and said electrolytic solution at least to part of said chemical decomposition layer.

15. The method of forming a nitride semiconductor epitaxial layer in accordance with claim 14, wherein at least one of said gas and said electrolytic solution contains a chemical substance suppressing decomposition of said nitride semiconductor epitaxial layer.

16. The method of forming a nitride semiconductor epitaxial layer in accordance with claim 1, wherein decomposition of said chemical decomposition layer at least with one of said gas and said electrolytic solution is performed further by applying one of light and heat at least to part of said chemical decomposition layer.

17. The method of forming a nitride semiconductor epitaxial layer in accordance with claim 16, wherein at least one of said gas and said electrolytic solution contains a chemical substance suppressing decomposition of said nitride semiconductor epitaxial layer.

18. The method of forming a nitride semiconductor epitaxial layer in accordance with claim 1, wherein said nitride semiconductor epitaxial layer contains a III-group element other than indium.

19. The method of forming a nitride semiconductor epitaxial layer in accordance with claim 1, wherein said chemical decomposition layer has an indium composition relative to nitrogen more than or equal to 15 mol %.

20. The method of forming a nitride semiconductor epitaxial layer in accordance with claim 1, wherein said chemical decomposition layer has an indium composition gradient structure in which an indium composition relative to nitrogen in said chemical decomposition layer increases from a first main surface to an inner portion and decreases from said inner portion to a second main surface.

21. The method of forming a nitride semiconductor epitaxial layer in accordance with claim 1, wherein said electrolytic solution contains a compound selectively coordinated to an indium ion.

22. The method of forming a nitride semiconductor epitaxial layer in accordance with claim 1, wherein said chemical decomposition layer further contains aluminum.

23. The method of forming a nitride semiconductor epitaxial layer in accordance with claim 22, wherein a difference in lattice constant between said chemical decomposition layer and a GaN semiconductor relative to the lattice constant of the GaN semiconductor is less than or equal to 1%.

24. The method of forming a nitride semiconductor epitaxial layer in accordance with claim 23, wherein said chemical decomposition layer has an indium composition relative to nitrogen more than or equal to 15 mol % and less than or equal to 20 mol %.

25. The method of forming a nitride semiconductor epitaxial layer in accordance with claim 1, wherein said chemical decomposition layer is one of a metal layer, a metal oxide layer, and a silicon-containing layer.

26. The method of forming a nitride semiconductor epitaxial layer in accordance with claim 1, wherein said nitride semiconductor epitaxial layer has a dislocation density lower than or equal to $1\times10^7$ cm$^{-2}$.

27. The method of forming a nitride semiconductor epitaxial layer in accordance with claim 1, wherein said nitride semiconductor substrate is a GaN substrate, and said nitride semiconductor epitaxial layer is a GaN epitaxial layer.

28. The method of forming a nitride semiconductor epitaxial layer in accordance with claim 27, wherein said electrolytic solution contains a gallium ion.

29. The method of forming a nitride semiconductor epitaxial layer in accordance with claim 1, wherein said nitride semiconductor epitaxial layer as separated has a thickness more than or equal to 3 μm and less than or equal to 100 μm.

30. The method of forming a nitride semiconductor epitaxial layer in accordance with claim 1, wherein said nitride semiconductor epitaxial layer as separated includes a layer having a thickness more than or equal to 3 μm and less than or equal to 20 μm and a carrier concentration less than or equal to $2\times10^{16}$ cm$^{-3}$.

31. The method of forming a nitride semiconductor epitaxial layer in accordance with claim 1, further comprising the steps of, after the step of separating said nitride semiconductor epitaxial layer from said nitride semiconductor substrate:
    surface treating a main surface of said nitride semiconductor substrate as separated to reproduce said nitride semiconductor substrate;
    growing at least one layer of further nitride semiconductor epitaxial layer on said nitride semiconductor substrate as reproduced with another chemical decomposition layer interposed therebetween; and
    decomposing said other chemical decomposition layer at least with one of said gas and said electrolytic solution at least one of during and after the step of growing said further nitride semiconductor epitaxial layer, thereby separating said further nitride semiconductor epitaxial layer from said nitride semiconductor substrate as reproduced.

32. A method of manufacturing a nitride semiconductor device, comprising the steps of:
    growing at least one layer of nitride semiconductor epitaxial layer on a nitride semiconductor substrate having a dislocation density lower than or equal to $1\times10^7$ cm$^{-2}$ with a chemical decomposition layer interposed therebetween, said chemical decomposition layer being chemically decomposed with at least one selected from the group consisting of a gas and an electrolytic solution;
    decomposing said chemical decomposition layer at least with one of said gas and said electrolytic solution at least one of during and after the step of growing said nitride semiconductor epitaxial layer, thereby separating said nitride semiconductor epitaxial layer from said nitride semiconductor substrate; and
    joining said semiconductor epitaxial layer as separated to a supporting substrate, wherein
    said chemical decomposition layer is a nitride semiconductor layer containing indium.

33. The method of manufacturing a nitride semiconductor device in accordance with claim 32, wherein said supporting substrate is a conductive supporting substrate having an area specific resistance less than or equal to 0.05 mΩ·cm$^2$.

34. The method of manufacturing a nitride semiconductor device in accordance with claim 33, further comprising the step of forming a recess having a depth from a main surface of said nitride semiconductor epitaxial layer to reach said chemical decomposition layer, after the step of growing said nitride semiconductor epitaxial layer and before the step of separating said nitride semiconductor epitaxial layer from said nitride semiconductor substrate.

35. The method of manufacturing a nitride semiconductor device in accordance with claim 34, wherein said recess is formed by gas phase etching.

* * * * *